(12) United States Patent
Okayasu et al.

(10) Patent No.: US 11,101,206 B2
(45) Date of Patent: Aug. 24, 2021

(54) SEMICONDUCTOR DEVICE AND ELECTRONIC DEVICE

(71) Applicant: RENESAS ELECTRONICS CORPORATION, Tokyo (JP)

(72) Inventors: Yoshitaka Okayasu, Tokyo (JP); Shuuichi Kariyazaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/653,098

(22) Filed: Oct. 15, 2019

(65) Prior Publication Data

US 2020/0168540 A1 May 28, 2020

(30) Foreign Application Priority Data

Nov. 26, 2018 (JP) .............................. JP2018-219901

(51) Int. Cl.
*H01L 23/498* (2006.01)
*H01L 25/16* (2006.01)
(Continued)

(52) U.S. Cl.
CPC .. *H01L 23/49838* (2013.01); *H01L 23/49816* (2013.01); *H01L 23/49833* (2013.01);
(Continued)

(58) Field of Classification Search
CPC ......... H01L 23/49838; H01L 23/49816; H01L 23/49833; H01L 25/162; H01L 24/16; H01L 2224/16227; H01L 2224/05655; H01L 2224/451; H01L 2224/13116; H01L 2224/05147; H01L 2224/13113; H01L 2224/13139; H01L 2224/05666; H01L 2224/05155; H01L 2224/13147;
(Continued)

(56) References Cited

U.S. PATENT DOCUMENTS

2015/0084051 A1* 3/2015 Kubo .................... H01L 23/642
257/48
2017/0033038 A1* 2/2017 Nakagawa ........ H01L 23/49816
(Continued)

FOREIGN PATENT DOCUMENTS

JP 11-145319 A 5/1999

*Primary Examiner* — Ahmed N Sefer
(74) *Attorney, Agent, or Firm* — McDermott Will & Emery LLP

(57) ABSTRACT

The lower surface of the wiring substrate includes a first region overlapping with the semiconductor chip mounted on the upper surface, and a second region surrounding the first region and not overlapping with the semiconductor chip. The first region includes a third region in which the plurality of external terminals is not arranged, and a fourth region surrounding the third region in which the plurality of external terminals is arranged. The plurality of external terminals includes a plurality of terminals arranged in the fourth region of the first region and a plurality of terminals arranged in the second region. The plurality of terminals includes a plurality of power supply terminals for supplying a power supply potential to the core circuit of the semiconductor chip, and a plurality of reference terminals for supplying a reference potential to the core circuit of the semiconductor chip.

16 Claims, 29 Drawing Sheets

(51) Int. Cl.
*H01L 23/00* (2006.01)
*H01L 23/64* (2006.01)
*H01L 23/50* (2006.01)
*H01L 23/367* (2006.01)

(52) U.S. Cl.
CPC ............ *H01L 23/50* (2013.01); *H01L 23/642* (2013.01); *H01L 24/16* (2013.01); *H01L 25/162* (2013.01); *H01L 23/3675* (2013.01); *H01L 23/49822* (2013.01); *H01L 23/49827* (2013.01); *H01L 24/13* (2013.01); *H01L 24/32* (2013.01); *H01L 24/48* (2013.01); *H01L 24/73* (2013.01); *H01L 2224/16227* (2013.01)

(58) Field of Classification Search
CPC ... H01L 2224/2919; H01L 2224/05647; H01L 2224/05124; H01L 2224/05644; H01L 2224/13155; H01L 2224/13111; H01L 23/49822; H01L 23/49827; H01L 23/3675; H01L 23/50; H01L 24/13; H01L 24/32; H01L 24/48; H01L 24/73; H01L 23/642
See application file for complete search history.

(56) References Cited

U.S. PATENT DOCUMENTS

| | | | |
|---|---|---|---|
| 2017/0062322 A1* | 3/2017 | Sakata | H01L 24/49 |
| 2017/0213776 A1* | 7/2017 | Oikawa | H01L 23/00 |
| 2019/0115295 A1* | 4/2019 | Kariyazaki | H01L 23/49827 |
| 2019/0198462 A1* | 6/2019 | Nakagawa | H01L 23/552 |

\* cited by examiner

SEMICONDUCTOR DEVICE AND ELECTRONIC DEVICE

CROSS-REFERENCE TO RELATED APPLICATIONS

The disclosure of Japanese Patent Application No. 2018-219901 filed on Nov. 26, 2018 including the specification, drawings and abstract is incorporated herein by reference in its entirety.

BACKGROUND OF THE INVENTION

The present invention relates to a semiconductor device and an electronic device including the semiconductor device, and, for example, to a semiconductor device in which a semiconductor chip is mounted on a wiring substrate and a technique effective for the application to the electronic device. The background of the invention In Japanese Unexamined Patent Application No. 11-145319, there is disclosed a semiconductor device having a structure in which solder balls are not disposed on the opposite side of a region where a semiconductor chip is mounted on a lower surface to which a plurality of solder balls are connected in a wiring substrate on which a semiconductor chip is mounted.

SUMMARY OF THE INVENTION

In the case of a Ball Grid Allay (BGA) type semiconductor device in which a plurality of terminals such as solder balls is arranged in a matrix on the other side of a chip mounting surface on which a semiconductor chip is mounted, since external terminals can be arranged on a mounting surface of a wiring substrate, the Ball Grid Allay (BGA) type semiconductor device is effective as one solution for suppressing an increase of mounting area of the semiconductor device while increasing the number of terminals of the semiconductor device.

However, the wiring substrate is prone to warp deformation, and a problem related to this warp deformation occurs. For example, when the coplanarity of a plurality of terminals (the variation in the height of the vertex of the terminals) increases due to warp deformation, some of the plurality of terminals is not connected to the terminals of the mounting substrate. For example, in order to stably operate a circuit of the semiconductor chip mounted on the wiring substrate, a large number of paths for supplying a power supply potential and a reference potential are required. However, if the coplanarity is large, some of the terminals are not connected to the terminals of the mounting substrate, so that necessary power may be insufficient.

Other objects and novel features will become apparent from the description of this specification and the accompanying drawings.

A lower surface of the wiring substrate included in the semiconductor device according to the embodiment includes a first region overlapping with the semiconductor chip mounted on an upper surface, and a second region surrounding the first region and not overlapping with the semiconductor chip. The first region includes a third region in which the plurality of second terminals formed on the lower surface of the wiring substrate are not arranged, and a fourth region surrounding the third region in which the plurality of second terminals is arranged. The plurality of second terminals includes a plurality of first region terminals arranged in the fourth region of the first region, and a plurality of second region terminals arranged in the second region. The plurality of first region terminals includes a plurality of first power supply terminals for supplying a first power supply potential to a circuit of the semiconductor chip, a plurality of reference terminals for supplying a reference potential to a circuit of the semiconductor chip, and the area of the third region is 56% or less of the area of the first region.

According to the above embodiment, the performance of the semiconductor device can be improved.

DESCRIPTIONS OF THE PREFERRED EMBODIMENTS

Figure 1:
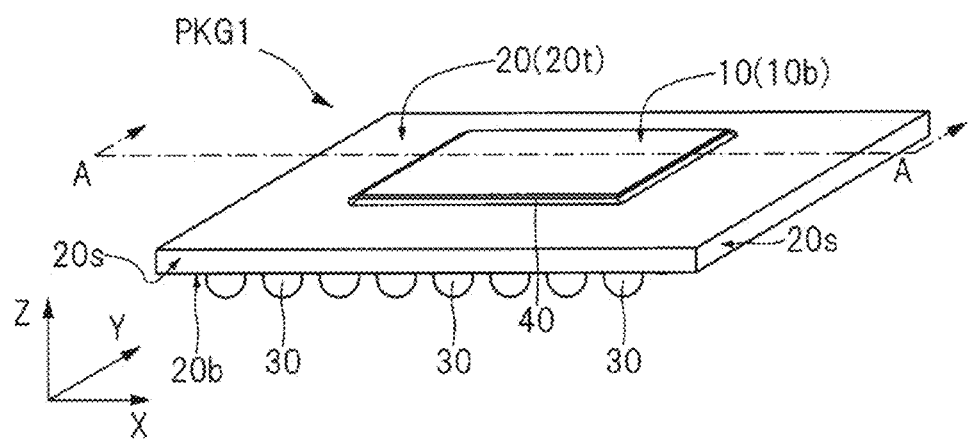
FIG. 1 is a perspective view a semiconductor device according to an embodiment.

In the present application, descriptions of embodiments will be divided into a plurality of sections or the like for convenience of description, if necessary, except where expressly stated otherwise, these are not independent from each other, and each part of a single example, one of which is a partial detail or a part or all of the other, whether before or after the description. In principle, descriptions of similar parts are omitted. Also, each component in an embodiment is not essential, unless expressly stated otherwise, theoretically limited to that number, and obviously otherwise from the context.

Similarly, in the description of the embodiment and the like, "X consisting of A" or the like with respect to the material, composition, and the like does not exclude elements other than A, except when it is clearly indicated that this is not the case and when it is obvious from the context that this is not the case. For example, regarding a component, it means "X including A as a main component" or the like. For example, a "silicon member" or the like is not limited to pure silicon, and it is needless to say that a member including a SiGe (silicon-germanium) alloy, a multi-element alloy containing silicon as its main component, other additives, or the like is also included. In addition, the gold plating, Cu layer, nickel plating, and the like include not only pure materials, but also members containing gold, Cu, nickel, and the like as main components, respectively, unless otherwise specified.

In addition, reference to a specific numerical value or quantity may be greater than or less than that specific numerical value, unless expressly stated otherwise, theoretically limited to that number, and obviously not so from the context. In the following description, a certain value and another value may be referred to as "the same" or "the identification", but the meaning of "the same" or "the identification" includes strictly the same cases as well as cases in which there is an error within a range that can be considered to be substantially equivalent.

In the drawings of the embodiments, the same or identical parts are denoted by the same or identical symbols or reference numerals, and the description will not be repeated in principle.

In addition, in the attached drawings, hatching and the like may be omitted even in a cross-section when it becomes complicated or when it is clearly distinguished from a gap. In this connection, even if the hole is closed in plan, the outline of the background may be omitted when it is obvious from the description or the like. In addition, hatching or dot patterns may be added to indicate that it is not a void, even if it is not a cross-section, or to indicate the boundary of a region.

Figure 2:
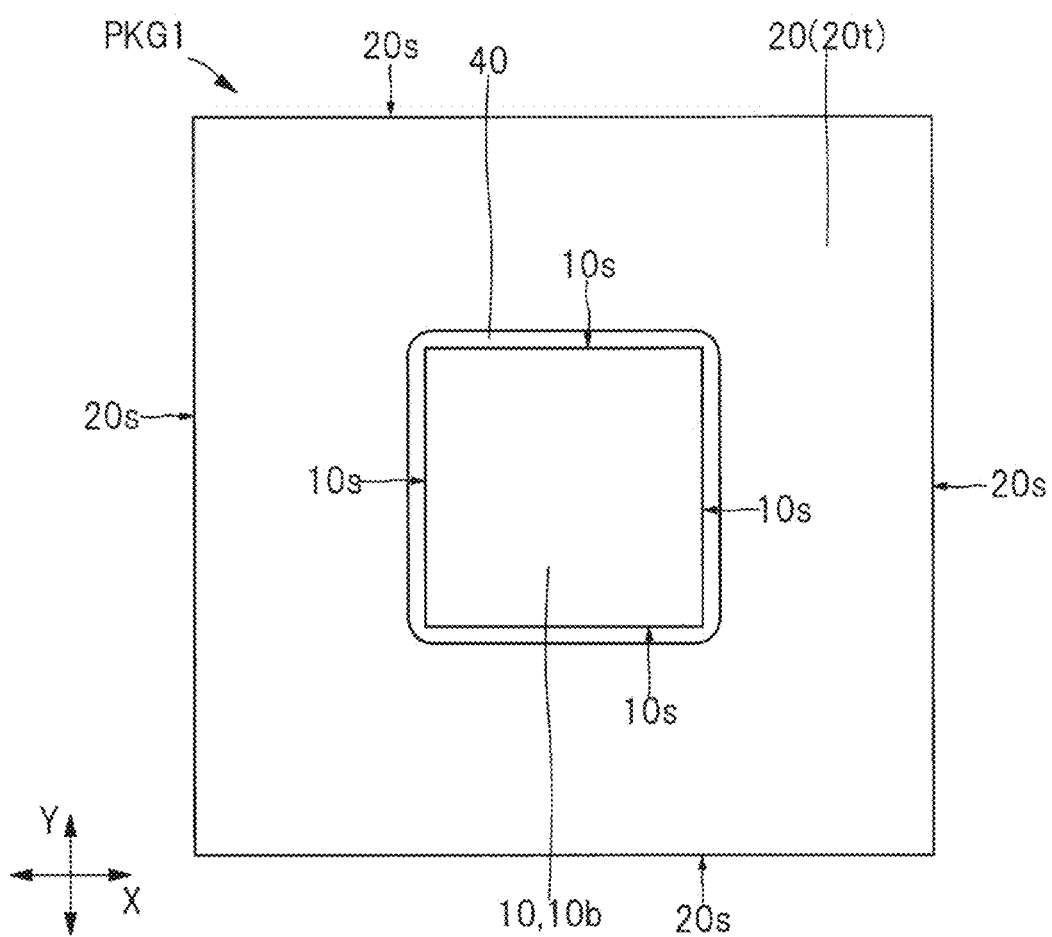
FIG. 2 is a top view of the semiconductor device shown in FIG. 1.
Figure 3:
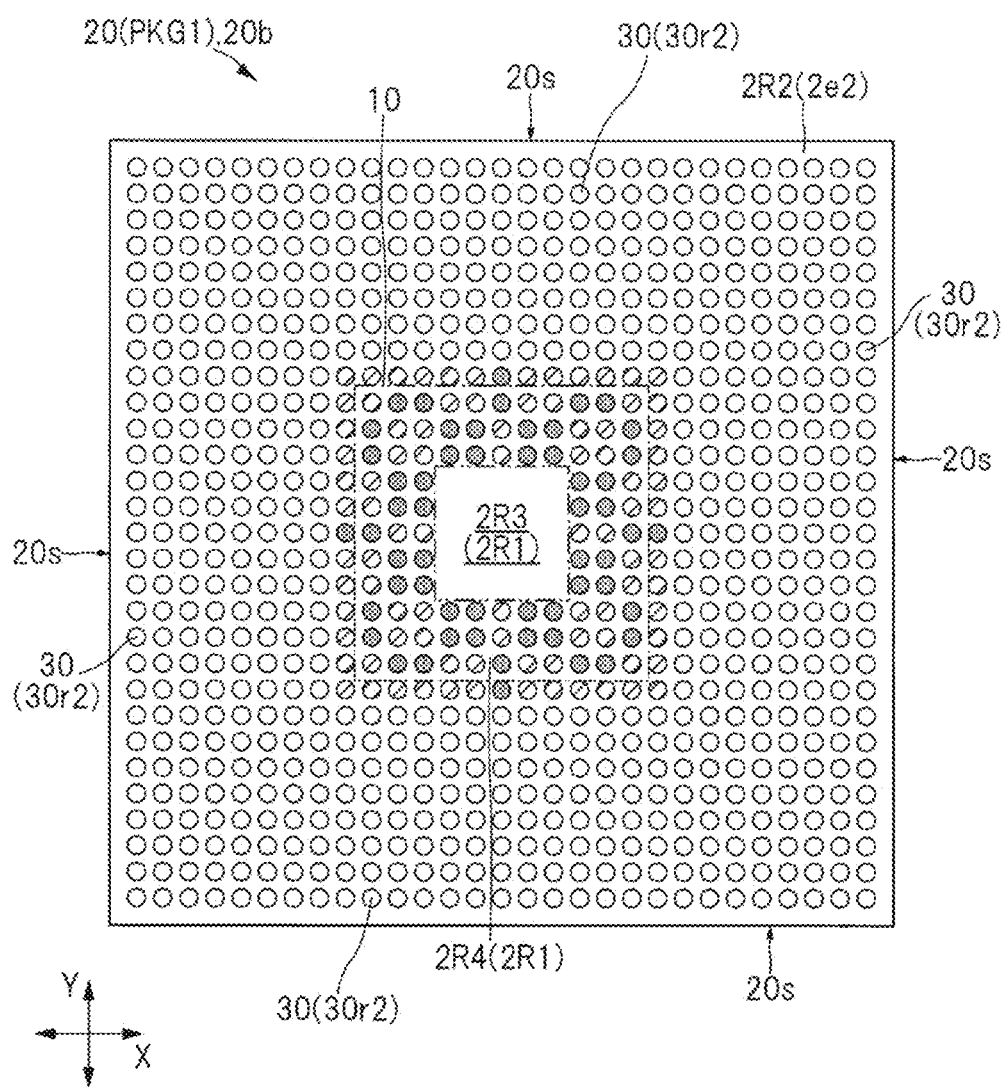
FIG. 3 is a bottom view of the semiconductor device shown in FIG. 1.

<Semiconductor device> First, a schematic configuration of a semiconductor device PKG1 of the present embodiment will be described with reference to FIGS. 1 to 4. FIG. 1 is a perspective view of the semiconductor device of the present embodiment, and FIG. 2 is a top view of the semiconductor device shown in FIG. 1. FIG. 3 is a bottom view of the semiconductor device shown in FIG. 1.

Figure 4:
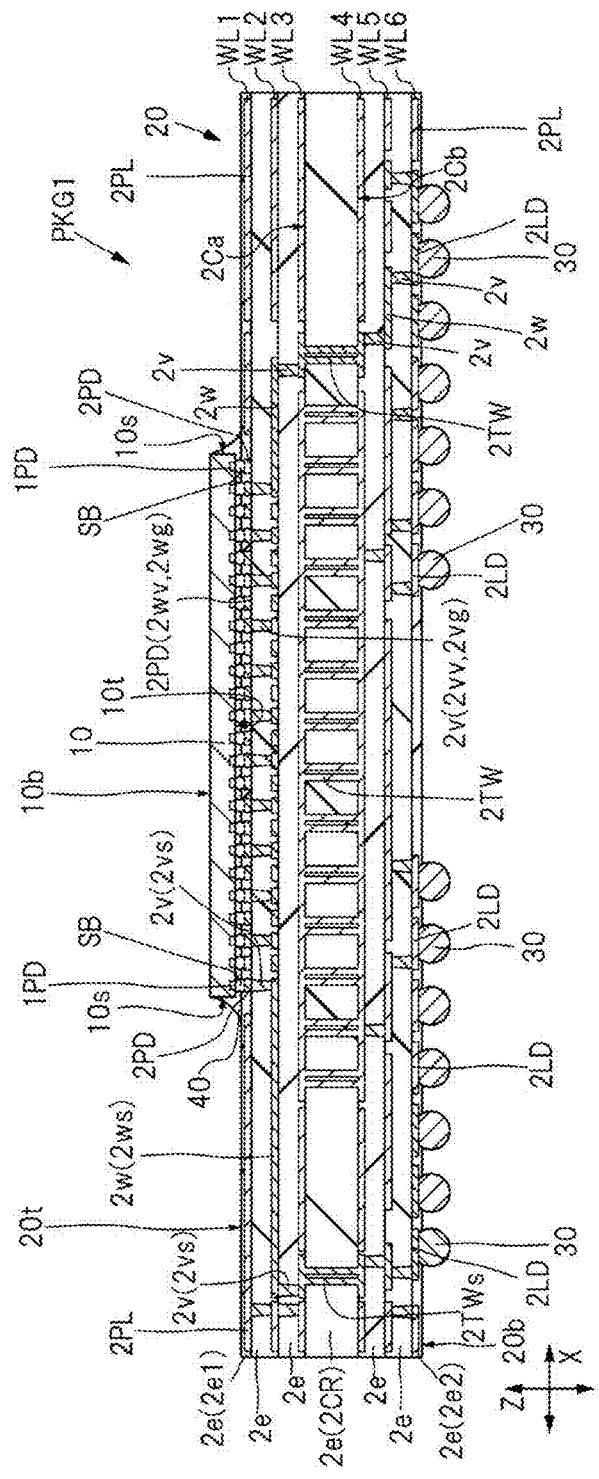
FIG. 4 is a cross-sectional view taken along line A-A FIG. 1.

FIG. 4 is a cross-sectional view taken along line A-A of FIG. 1. Though not shown, various modifications other than the embodiments shown in FIGS. 1 to 4 can be applied to the number of terminals (the terminal 2PD, the land 2LD, and the external terminal 30).

As shown in FIG. 1, the semiconductor device PKG1 of the present embodiment includes a semiconductor chip 10 and a wiring substrate 20 having an upper surface (surface, main surface, chip mounting surface) 20t on which the semiconductor chip 10 is mounted. For example, FIG. 4 is a cross-sectional view of the semiconductor device shown in FIG. 1, but the number of external terminals 30 is shown to be smaller than that of the example shown in FIG. 3 for the sake of clarity.

As shown in FIG. 4, the semiconductor chip 10 has a front surface (main surface, upper surface) 10t, a back surface (main surface, lower surface) 10b on the side opposite to the front surface 10t, and a side surface 10s positioned between the front surface 10t and the back surface 10b. As shown in FIG. 2, the semiconductor chip 10 has a rectangular outer shape having a plane area smaller than that of the wiring substrate 20 in plan view. In the embodiment shown in FIG. 2, the semiconductor chip 10 is mounted on the center of the upper surface 20t of the wiring substrate 20 such that each of the four side surfaces 10s extends along each of the four side surfaces 2s of the wiring substrate 20.

As shown in FIG. 4, a plurality of electrodes (chip electrodes, electrode pads, and electrode portions) 1PD is arranged on the front surface 10t of the semiconductor chip 10. In the present embodiment, a plurality of electrodes 1PD is arranged in a matrix form or an array form on the front face 10t of the semiconductor chip 10. By arranging a plurality of electrodes 1PD serving as external input/output terminals of the semiconductor chip 10 in a matrix form, even if the number of electrodes included in the semiconductor chip 10 increases, an increase in the planar area can be suppressed. Further, when the electrodes 1PD for power supply are arranged in the central portion of the semiconductor chip 10 in plan view, the power supply path to the core circuits formed in the central portion of the semiconductor chip 10 can be shortened.

The surface 10t of the semiconductor chip 10 faces the upper surface 20t of the wiring substrate 20. As described above, the method in which the semiconductor chip 10 is mounted on the wiring substrate 20 such that the surface 10t which is the electrode forming surface of the semiconductor chip 10 faces the upper surface 20t which is the chip mounting surface of the wiring substrate 20 is called a face-down mounting method or a flip-chip connection method.

In the flip-chip connecting method, the electrodes 1PD arranged on the front surface 10t of the semiconductor chip 10 and the terminals 2PD arranged on the upper surface 20t of the wiring substrate 20 are connected to each other via the protruding electrodes SB. As shown in FIG. 4, the protruding electrodes SB are connected to the plurality of electrodes 1PD, and the plurality of electrodes 1PD of the semiconductor chip 10 and the plurality of terminals 2PD of the wiring substrate 20 are electrically connected to each other via the plurality of protruding electrodes SB.

a protrusive electrode SB is a metal member formed so as to protrude on the surface 10t of the semiconductor chip 10. In the present embodiment, the protrusive electrode SB is a so-called solder bump in which a solder material is laminated on the electrode 1PD with an under-bump metal interposed therebetween. The base metal film can be exemplified by, for example, a laminated film in which titanium (Ti), copper (Cu), and nickel (Ni) are laminated from the connecting surface with the electrodes 1PD (in some cases, a gold (Au) film is further formed on the nickel film). The solder material constituting the solder bumps is, for example, a Sn—Pb solder material containing lead (Pb) or a so-called lead-free solder substantially free of Pb. Examples of lead-free solders include, for example, tin (Sn), tin-bismuth (Sn—Bi), tin-copper-silver (Sn—Cu—Ag), tin-copper (Sn—Cu), and the like. Here, the lead-free solder means a solder in which the content of lead (Pb) is 0.1 wt % or less, and this content is determined as a standard of the Restriction of Hazardous Substances(RoHS) command.

When the semiconductor chip 10 is mounted on the wiring substrate 20, solder bumps are formed on both the plurality of electrodes 1PD and the plurality of terminals 2PD in advance, and the solder bumps are contacted with each other and subjected to a heat treatment (reflow treatment), whereby the solder bumps are integrated with each other to form the protrusive electrodes SB. As a modification to the present embodiment, a pillar bump in which a solder film is formed on the tip surface of a conductor pillar made of copper (Cu) or nickel (Ni) may be used as the protrusive electrode SB.

Although illustration is omitted, as a modification to the present embodiment, there is also a case where the back surface 10b of the semiconductor chip faces the chip mounting surface of the wiring substrate 20, which is referred to as a face-up mounting method. The electrodes 1PD of the chips 10 are arranged on the periphery of the front face 10t. The electrodes 1PD of the semiconductor chip and the terminals 2PD of the wiring substrate 20 are electrically connected to each other via wires (not shown). When semiconductor chips are mounted on the wiring substrate 20 by the face-down method as in the present embodiment, the arrangement densities of the electrodes 1PD per unit area can be improved. In addition, when the electrode 1PD of the semiconductor chip 10 and the terminal 2PD of the wiring substrate 20 are electrically connected to each other via the protrusive electrode SB as in the present embodiment, the impedances of the transmission paths between the electrode 1PD and the terminal 2PD can be reduced as compared with the connection method using a wire.

Although not shown, a plurality of semiconductor elements (circuit elements) is formed on the main surface of the semiconductor chip 10 (more specifically, a semiconductor element forming region provided on the element forming surface of the semiconductor substrate which is the base material of the semiconductor chip 10). The plurality of electrodes 1PD is electrically connected to the plurality of semiconductor elements via wirings (not shown) formed in wiring layers disposed inside the semiconductor chips 10 (in detail, between the surfaces 10t and semiconductor element forming regions (not shown)).

The semiconductor chip 10 (in detail, the base material of the semiconductor chip 10) is made of, for example, silicon (Si). An insulating film covering the base material and the wirings of the semiconductor chip 10 is formed on the front surface 10t, and the front surfaces of the plurality of electrodes 1PD is exposed from the insulating film in the opening portions formed in the insulating film. The plurality of electrodes 1PD is made of metals, and in the present embodiment, are made of, for example, aluminum (Al) or copper (Cu).

Further, as shown in FIG. 4, the wiring substrate 20 on which the semiconductor chip 10 is mounted has an upper surface 20t on which the semiconductor chip 10 is mounted, a lower surface (surface, main surface, surface to be mounted) 20b on the opposite side of the upper surface 20t, and a plurality of side surfaces 20s (see FIGS. 1 to 2) disposed between the upper surface 20t and the lower surface 20b. As shown in FIG. 3, the wiring substrate 20 has a rectangular outer shape in plan view.

The wiring substrate 20 has a plurality of wiring layers that electrically connects the terminal 2PD on the upper surface 20t, which is the chip-mounting surface, and the land 2LD on the lower surface 20b, which is the chip-mounting surface, to each other. In the embodiment shown in FIG. 4, the wiring layer has six wiring layers, namely, a wiring layer WL1, a wiring layer WL2, a wiring layer WL3, a wiring layer WL4, a wiring layer WL5, and a wiring layer WL6, in order from the upper surface 20t. The respective wiring layers are covered with an insulating film 2e.

A plurality of opening portions is provided in the insulating film 2e covering each wiring layer, and via wirings (vias and interlayer conductive paths) 2v are buried in each of the plurality of opening portions. Each of the wiring layers WL1, the WL2, and the WL3, and each of the wiring layers WL4, the WL5, and the WL6 are electrically connected via a plurality of via wirings 2v.

The plurality of wiring layers of the wiring substrate 20 is formed, for example, by laminating a plurality of wiring layers on the upper surface 2Ca and the lower surface 2Cb of an insulating layer (core layer, core material, and core insulating layer) 2CR made of a prepreg material in which a glass fiber is impregnated with a resin by a build-up method. The wiring layer WL3 on the upper surface 2Ca of the insulating layer 2CR and the wiring layer WL4 on the lower surface are electrically connected via a plurality of through-hole wirings (interlayer conductive paths) 2TW embedded in a plurality of through-holes (through-holes) provided so as to penetrate from one of the upper surface 2Ca and the lower surface 2Cb to the other of the upper surface 2Ca and the lower surface 2Cb.

Although FIG. 4 shows a wiring substrate 20 having an insulating layer 2CR as a core layer as an example of the wiring substrate, a so-called coreless substrate having no core layer can be used as a modification to FIG. 4. In this case, the through-hole wiring 2TW is not formed on the wiring substrate of the modified example. In addition, in the wiring substrate of this modification, a plurality of stacked wiring layers is electrically connected to each other through a plurality of via wiring 2v provided between the wiring layers.

A plurality of terminals (terminal portions, pads, semiconductor chip connecting terminals) 2PD electrically connected to the semiconductor chip 10 is formed on the upper surface 20t of the wiring substrate 20. Each of the plurality of terminals 2PD is an internal-interface terminal for electrically connecting the semiconductor chip 10 and the wiring substrate 20 to each other. A plurality of lands (terminals, external terminals, electrodes, and external electrodes) 2LD, which is external input/output terminals of the semiconductor device PKG1, are formed on the lower surface 20b of the wiring substrate 20. The land 2LD is an external interface terminal for electrically connecting the wiring substrate 20 and an external device (e.g., a mounting board 50 shown in FIG. 20 (to be described later)).

The plurality of terminals 2PD and the plurality of lands 2LD are electrically connected via a plurality of wirings 2w formed on the wiring substrate 20 and a plurality of via wirings 2v as interlayer conductive paths and through-hole wirings 2TW electrically connecting the wiring layer WL3 and the wiring layer WL4. In the embodiment shown in FIG. 4, an insulating layer 2CR serving as a core layer is provided between the wiring layer WL3 and the wiring layer WL4 of the wiring substrate 20.

The core layer is harder and thicker than the other insulating layer 2e. Therefore, the insulating layer 2CR is provided with a plurality of through holes formed so as to penetrate from one to the other of the upper surface 2Ca and the lower surface 2Cb of the insulating layer 2CR. Each of the plurality of through holes is filled with a conductor (e.g., a metal such as copper) to form a through-hole wiring 2TW functioning as an interlayer conductive path. The detailed configuration of each wiring layer included in the wiring substrate 20 will be described later.

In the embodiment shown in FIG. 4, external terminals (solder balls, solder materials, terminals, external terminals, electrodes, and external electrodes) 30 are connected to each of the plurality of lands 2LD. The external terminals 30 are conductive members that electrically connect a plurality of terminals (not shown) on the mounting substrate and a plurality of lands 2LD when the semiconductor device PKG1 is mounted on a mounting substrate (to be described later) shown in FIG. 20. The external terminal 30 is made of, for example, lead-free solder, similarly to the above-described protrusive electrode SB.

As shown in FIG. 3, the plurality of external terminals 30 is arranged in a matrix. Although not shown in FIG. 3, a plurality of lands 2LD (see FIG. 4) to which a plurality of external terminals 30 is bonded are also arranged in a matrix form. In this manner, a semiconductor device in which a plurality of external terminals (external terminals 30, lands 2LD) is arranged in a matrix form on the mounting surface of the wiring substrate 20 is referred to as an area array type semiconductor device. Since the area array type semiconductor device can effectively utilize the mounting surface (lower surface 20b) side of the wiring substrate 20 as a space for arranging external terminals, the area array type semiconductor device is preferable in that an increase in the mounting area of the semiconductor device can be suppressed even if the number of external terminals increases. In other words, a semiconductor device in which the number of external terminals increases with higher functionality and higher integration can be mounted in a space-saving manner.

In the examples shown in FIGS. 1, 3, and 4, a so-called BGA (Ball Grid Array) type semiconductor package using solder balls which are ball-shaped solder materials is exemplarily shown as the external terminals 30, but there are various modifications in the arrangement and the structures of the external terminals.

For example, there is a modification such as a structure in which a plurality of lands 2LD is exposed on the lower surface 20b shown in FIG. 4, or a structure in which a thin soldering material is bonded to a plurality of lands 2LD exposed on the lower surface 20b. Semiconductor packages of these variants are referred to as Land Grid Array type semiconductor packages.

As shown in FIG. 4, an underfill resin 40 is disposed between the semiconductor chip 10 and the wiring substrate 20. The underfill resin 40 is disposed so as to close a gap between the front surface 10t of the semiconductor chip 10 and the upper surface 20t of the wiring substrate 20. The underfill resin 40 is made of an insulating (non-conductive) material (e.g., a resin material), and is disposed so as to seal an electrical connection portion (a joint portion of the plurality of protruding electrodes SB) between the semiconductor chip 10 and the wiring substrate 20. In this manner, by arranging the underfill resin 40 so as to seal the connection portions of the plurality of protrusive electrodes SB, it is possible to alleviate the stress generated in the electrical connection portions of the semiconductor chip 10 and the wiring substrate 20.

Figure 5:
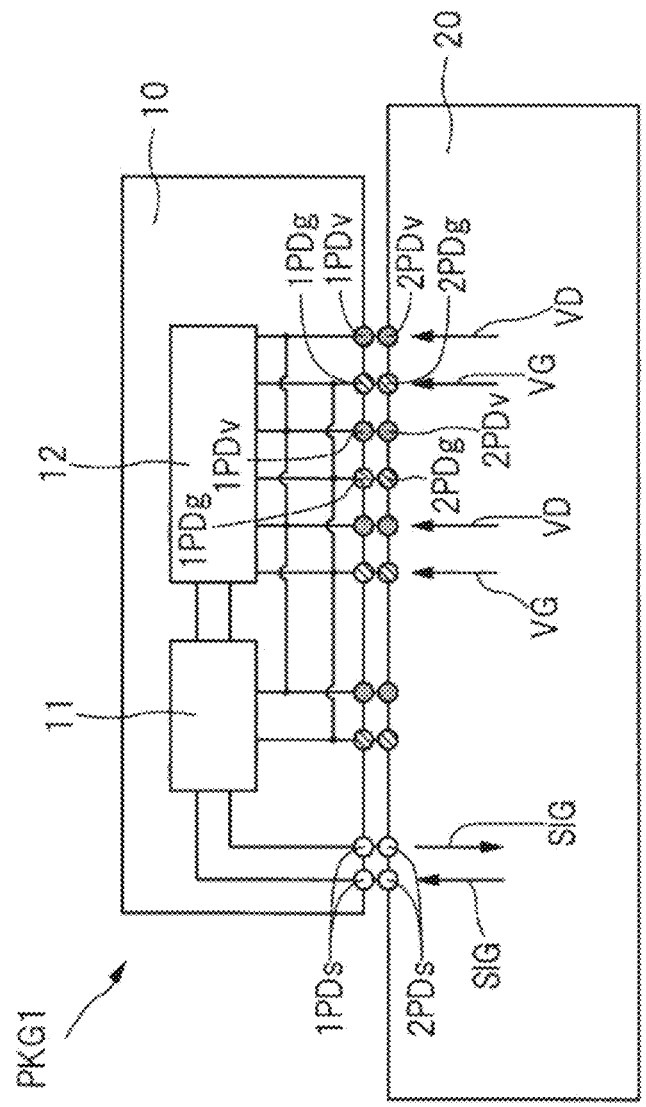
FIG. 5 is an explanatory diagram schematically showing an example of circuit configuration of semiconductor chip shown in FIG. 4.
Figure 6:
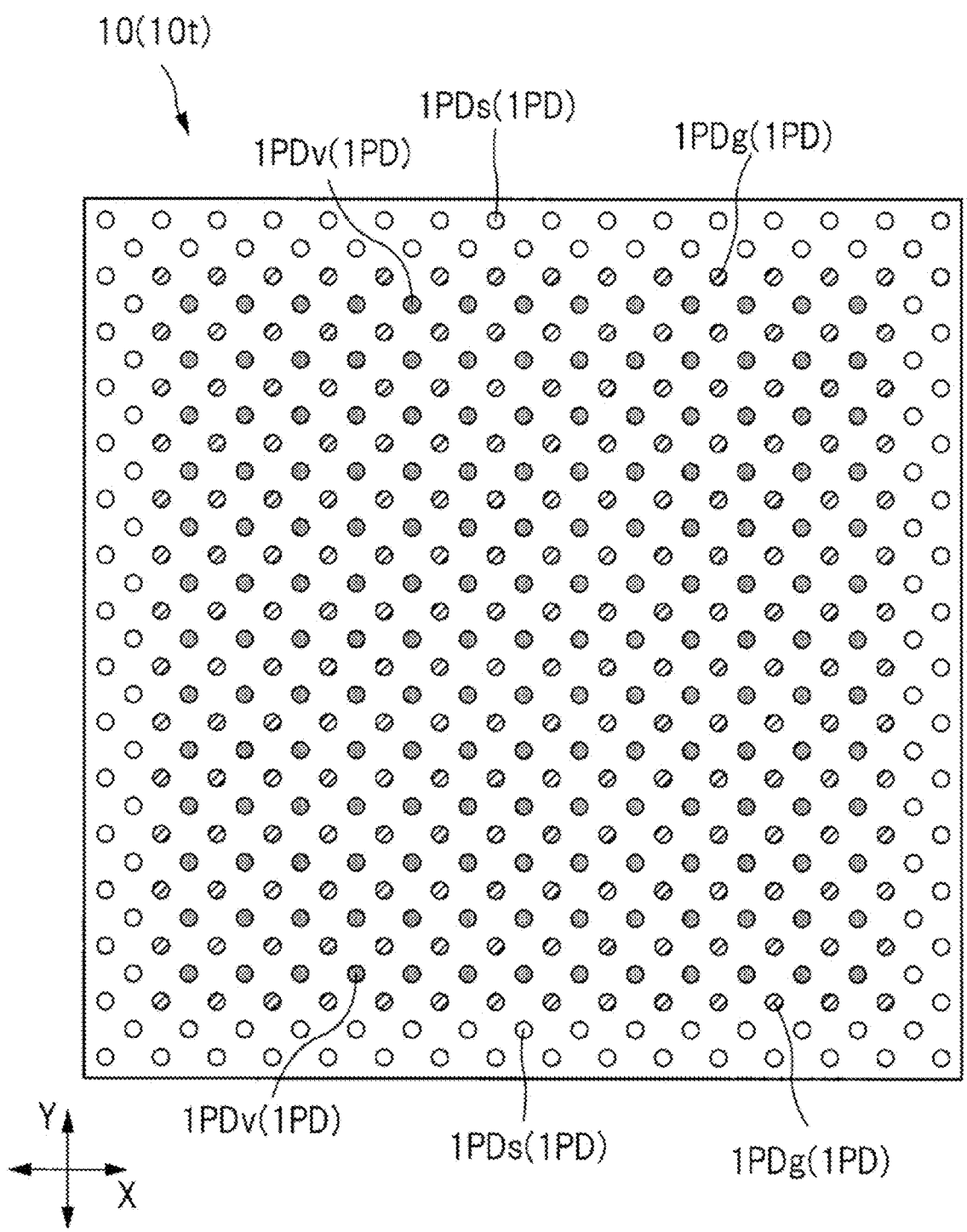
FIG. 6 is a plan view of the surface (the electrode forming surface) of the semiconductor chip shown in FIG. 1.

<Example of Circuit configuration> Next, an example of circuit configuration of the semiconductor chip shown in FIG. 4 will be described. FIG. 5 is an explanatory diagram schematically showing an example of the circuit configuration of the semiconductor chip shown in FIG. 4. FIG. 6 is a plan view of the surface of the semiconductor chip shown in FIG. 1. FIG. 6 is a plan view, but in order to distinguish each of the plurality of electrodes 1PDv, the plurality of electrodes 1PDg, and the plurality of electrodes 1PDs, dotted patterns and hatching are shown. In FIG. 6, the electrode 1PDs, the electrode 1PDv, and the electrode 1PDg of the plurality of electrodes 1PD shown in a circle are shown in white, dot patterns, and hatched, respectively.

As shown in FIG. 5, the semiconductor chip 10 includes an input/output circuit 11 for inputting or outputting an electric signal SIG to or from the outside of the semiconductor chip 10, and a core circuit 12 connected to the input/output circuit 11 for performing processing (e.g., arithmetic processing) on signal data. The plurality of electrodes 1PD of the semiconductor chip 10 includes a plurality of electrodes 1PDs, a plurality of electrodes 1PDv, and a plurality of electrodes 1PDg. Each of the plurality of electrodes 1PDs is connected to the input/output circuits 11, and is a signal terminal for transmitting an electric signal. Each of the plurality of electrodes 1PDv is connected to the core circuit 12, and is a power supply terminal for supplying a power supply potential VD for driving the core circuit 12. The plurality of electrodes 1PDv is connected to each other. Each of the plurality of electrodes 1PDg is a reference potential terminal which is connected to the core circuit 12 and supplies the reference potential VG to the core circuit 12. The plurality of electrodes 1PDg is connected to each other.

In the embodiment shown in FIG. 5, each of the plurality of electrodes 1PDv and the plurality of electrodes 1PDg is also electrically connected to the input/output circuits 11. The input/output circuit 11 is supplied with the power supply potential VD from the electrode 1PDv and the reference potential VG from the electrode 1PDg. The input/output circuit 11 can be driven by the potential difference between the power supply potential VD and the reference potential VG. Further, as in the example shown in FIG. 5, when the plurality of electrodes 1PDv is electrically connected to each other, for example, when the power demand instantaneously increases in the core circuit 12, the power supply potential is supplied from a plurality of paths.

Therefore, if the power supply potential can be stably supplied to each of the plurality of electrodes 1PDv, it is possible to suppress the generation of phenomena such as a voltage drop due to an instantaneous increase in power demand.

As a modification of the example shown in FIG. 5, when the drive voltage of the input/output circuit 11 and the drive voltage of the core circuit 12 are different from each other, a power supply potential different from the power supply potential VD may be supplied to the input/output circuit 11. When there are a plurality of core circuits 12 and the plurality of core circuits 12 operate with different driving voltages, different power supply potentials may be supplied to the plurality of core circuits 12. The plurality of electrodes 1PDv may be divided into a plurality of groups. In this case, if the groups are electrically separated from each other, different power supply potentials can be supplied to each group. However, as described above, in order to suppress a voltage drop caused by an instantaneous increase in power demand, it is preferable that a plurality of paths for supplying the respective power supply potentials is provided.

As shown in FIG. 6, the plurality of electrodes 1PDs, the plurality of electrodes 1PDv, and the plurality of electrodes 1PDg are regularly arranged on the front surface 10t of the semiconductor chip 10. The plurality of electrodes 1PDv and the plurality of electrodes 1PDg are arranged in the center of the front face 10t in the largest number. On the other hand, the plurality of electrodes 1PDs is arranged on the outer peripheral side of the surface 10t, in other words, on the peripheral portion between the outer edge of the surface 10t and the central portion.

In the embodiment shown in FIG. 6, each of the plurality of electrodes 1PDs is arranged on the outermost circumference and on the inner circumference of one of the outermost circumferences of the plurality of electrode 1PD arrays. The wiring path for transmitting the electric signal SIG (see FIG. 5) is drawn out to the outer peripheral side of the wiring substrate 20, as shown by the wiring 2ws in FIG. 9 (to be described later). Therefore, by arranging the plurality of electrodes 1PDs for transmitting the electric signal SIG on the outer periphery of the front surface 10t of the semiconductor chip 10, the path length of the signal transmission path can be shortened.

Each of the plurality of electrodes 1PDv and the plurality of electrodes 1PDg is arranged inside the plurality of electrodes 1PDs on the front face 10t. In other words, the plurality of electrodes 1PD is arranged between the plurality of electrodes 1PDv and the plurality of electrodes 1PDg and the outer edges of the surfaces 10t. The core circuitry 12 described above (see FIG. 5) is formed to overlap (overlap) the central portion of the surface 10t (the portion where the plurality of electrode 1PDv and the plurality of electrode 1PDg are arranged) in plane view.

The input/output circuit 11 shown in FIG. 5 is formed between the center portion of the surface 10t and the outer edge in plan view. Since the plurality of electrodes 1PDv and the plurality of electrodes 1PDg are formed so as to overlap with the core circuit 12, the power supply path to the core circuit 12 can be shortened. As a result, it is possible to reduce loss and noise when power is supplied to the core circuit 12.

Further, in the embodiment shown in FIG. 6, the electrode 1PDv and the electrode 1PDg are not arranged on the outermost circumference and on the inner side of one of the outermost circumferences of the array of the plurality of electrodes 1PD on the front face 10t. In addition, the electrode 1PDs is not arranged on two or more inner circumferences of the outermost circumference of the array of the plurality of electrodes 1PD on the front face 10t. However, in FIG. 6, an ideal configuration is shown in which the electrode 1PDs for transmitting signals is arranged on the outer periphery of the surface 10t of the semiconductor chip 10 and the electrode 1PDv for supplying the drive voltage and the electrode 1PDg are arranged in the center portion. Therefore, there are various modifications to the arrangement of the electrodes 1PD. For example, a part of the plurality of electrodes 1PDs may be arranged on two or more inner circumferences of the arrangement of the plurality of electrodes 1PD on the face 10t.

Alternatively, the electrode 1PDv or the electrode 1PDg may be arranged on the outermost circumference or on the inner circumference of one of the outermost circumferences. For example, in signal transmission, the signal transmission path and the reference path may run in parallel. When a transmission path of a reference potential is used as the reference path, it is preferable that an electrode 1PDg for a reference potential is arranged in the vicinity of the electrode 1PDs. In this instance, it is preferable that a part of the plurality of electrodes 1PDg is arranged on the inner circumference of the outermost circumference or one of the outermost circumferences among the arrangements of the plurality of electrodes 1PD.

As shown in FIG. 6, the plurality of electrodes 1PDv and the plurality of electrodes 1PDg are arranged in the central portion of the front surface 10t as follows. That is, each of the plurality of electrodes 1PDv and the plurality of electrodes 1PDg is arranged in a row along the X-direction. In addition, in the Y direction crossing the X direction (perpendicular in FIG. 6), a first electrode row composed of a plurality of electrodes 1PDv arranged in the X direction and a second electrode row composed of a plurality of electrodes 1PDg arranged in the X direction are alternately arranged. The plurality of electrodes 1PDv and the plurality of electrodes 1PDg are arranged at the same arrangement pitches (center-to-center distances) in the X-direction. Similarly, the plurality of electrodes 1PDv and the plurality of electrodes 1PDg are arranged at the same arrangement pitches (center-to-center distances) in the Y-direction. In addition, the first electrode row composed of the plurality of electrodes 1PDv arranged in the X direction is arranged at a position shifted by ½ with respect to the above-mentioned arrangement pitches with respect to the second electrode row composed of the plurality of electrodes 1PDg arranged in the X direction. In this manner, each of the plurality of electrodes 1PD is arranged in a staggered manner.

The "staggered arrangement" described above can be expressed as follows. That is, each of the plurality of electrodes 1PD in the first column in the Y direction is arranged between the adjacent electrodes 1PD of the plurality of electrodes 1PD in the second column in the Y direction, and each of the plurality of electrodes 1PD in the second column is arranged between the adjacent electrodes 1PD of the plurality of electrodes 1PD in the first column. Each of the plurality of electrodes 1PD in the third column in the Y direction is arranged between adjacent electrodes 1PD of the plurality of electrodes 1PD in the second column in the Y direction, and each of the plurality of electrodes 1PD in the second column is arranged between adjacent electrodes 1PD of the plurality of electrodes 1PD in the third column. Each of the plurality of electrodes 1PD in the first row in the X direction is arranged between adjacent electrodes 1PD of the plurality of electrodes 1PD in the second row in the X direction, and each of the plurality of electrodes 1PD in the second row is arranged between adjacent electrodes 1PD of the plurality of electrodes 1PD in the first row. Each of the plurality of electrodes 1PD in the third row in the X direction is arranged between adjacent electrodes 1PD of the plurality of electrodes 1PD in the second row in the X direction, and each of the plurality of electrodes 1PD in the second row is arranged between adjacent electrodes 1PD of the plurality of electrodes 1PD in the third row.

Further, focusing on the first row of the plurality of electrodes 1PDv arranged in the X direction and the second row of the plurality of electrodes 1PDg arranged in the X direction, the arrangement pitch (center-to-center distance) of the plurality of electrodes 1PDv in the X direction and the arrangement pitch (center-to-center distance) of the plurality of electrodes 1PDg in the X direction are equal to each other.

In order to stably operate the core circuit 12, it is necessary to stably supply the driving voltage for the core circuit 12 during the operation of the core circuit 12. As the performance of the semiconductor device improves, the operating speed (frequency) of the core circuit 12 increases. In FIG. 5, one core circuit 12 is shown as an example, but in order to improve the performance of the semiconductor chip 10, one semiconductor chip 10 has a plurality of core circuits 12, and each of the core circuits 12 operates at high speed. In this case, it is necessary to supply necessary and sufficient electric power in a timely manner in response to the power demand which rapidly fluctuates in accordance with the operation of the plurality of core circuits 12. In addition, the drive voltage tends to decrease in response to a demand for reduction in power consumption. Therefore, the allowable margin for the variation of the supplied voltage becomes small, and the operation of the core circuit 12 may be affected by small noise which does not cause a problem at the time of low-speed operation.

The driving voltage of the core circuit 12 shown in FIG. 5 is defined by a potential difference between the power supply potential VD and the reference potential VG. Therefore, it is preferable that a plurality of electrodes 1PDv and a plurality of electrodes 1PDg are arranged in the vicinity of the respective core circuits 12. When the supply path of the power supply potential and the supply path of the reference potential are adjacent to each other, noise in each path can be reduced by mutual inductance of the adjacent supply paths. Therefore, it is preferable that the plurality of electrodes 1PDv and the plurality of electrodes 1PDg are arranged in a balanced manner (e.g., alternately) rather than the plurality of groups of electrodes 1PDv and the plurality of groups of electrodes 1PDg being arranged in a locally gathered manner, respectively.

For example, in the example shown in FIG. 6, the plurality of electrodes 1PD included in the semiconductor chip 10 is arranged as follows. That is, the semiconductor chip 10 includes, in plan view, a power supply potential electrode group in which a plurality of electrodes 1PDv is arranged in the X direction, and a reference potential electrode group in which a plurality of electrodes 1PDg is arranged in the X direction, each of the power supply potential electrode group and the reference potential electrode group has a plurality of columns, and is alternately arranged along the Y direction in plan view. In this arrangement, the electrode 1PDv is arranged adjacent to one or more electrode 1PDg. The electrode 1PDg is arranged adjacent to one or more electrode 1PDv. In other words, the semiconductor chip 10 has a plurality of pairs of electrodes 1PDv and electrodes 1PDg adjacent to each other. In the plurality of pairs, the distances between the adjacent electrodes 1PDv and the adjacent electrodes 1PDg are equal to each other. In the arrangement of the electrode 1PD as shown in FIG. 6, it can be said that the plurality of electrodes 1PDv and the plurality of electrodes 1PDg are dispersed in a balanced manner.

Figure 7:
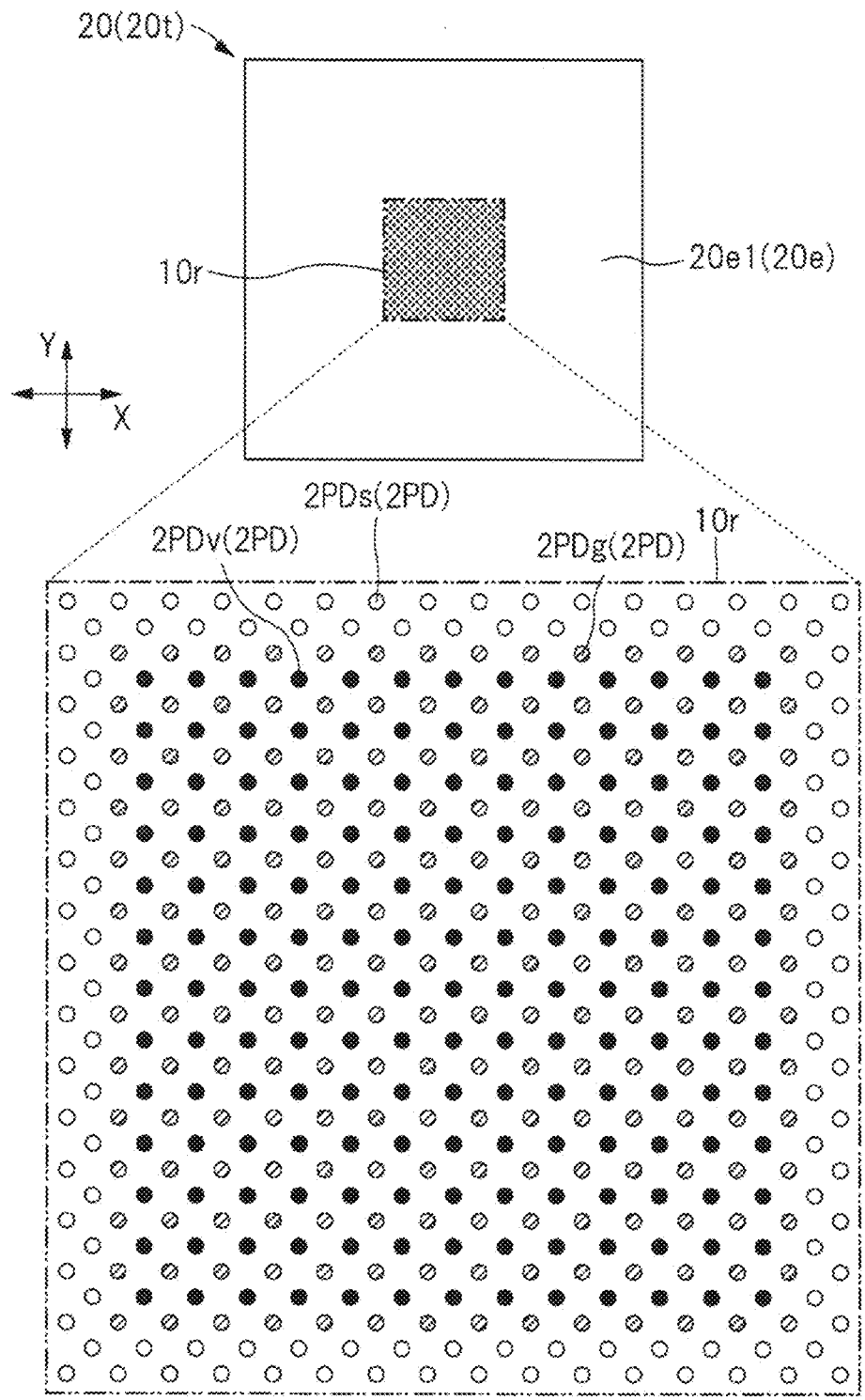
FIG. 7 is a plan view showing a state in which the semiconductor chip and the underfill resin are removed from the upper surface of the wiring substrate shown in FIG. 2.
Figure 8:
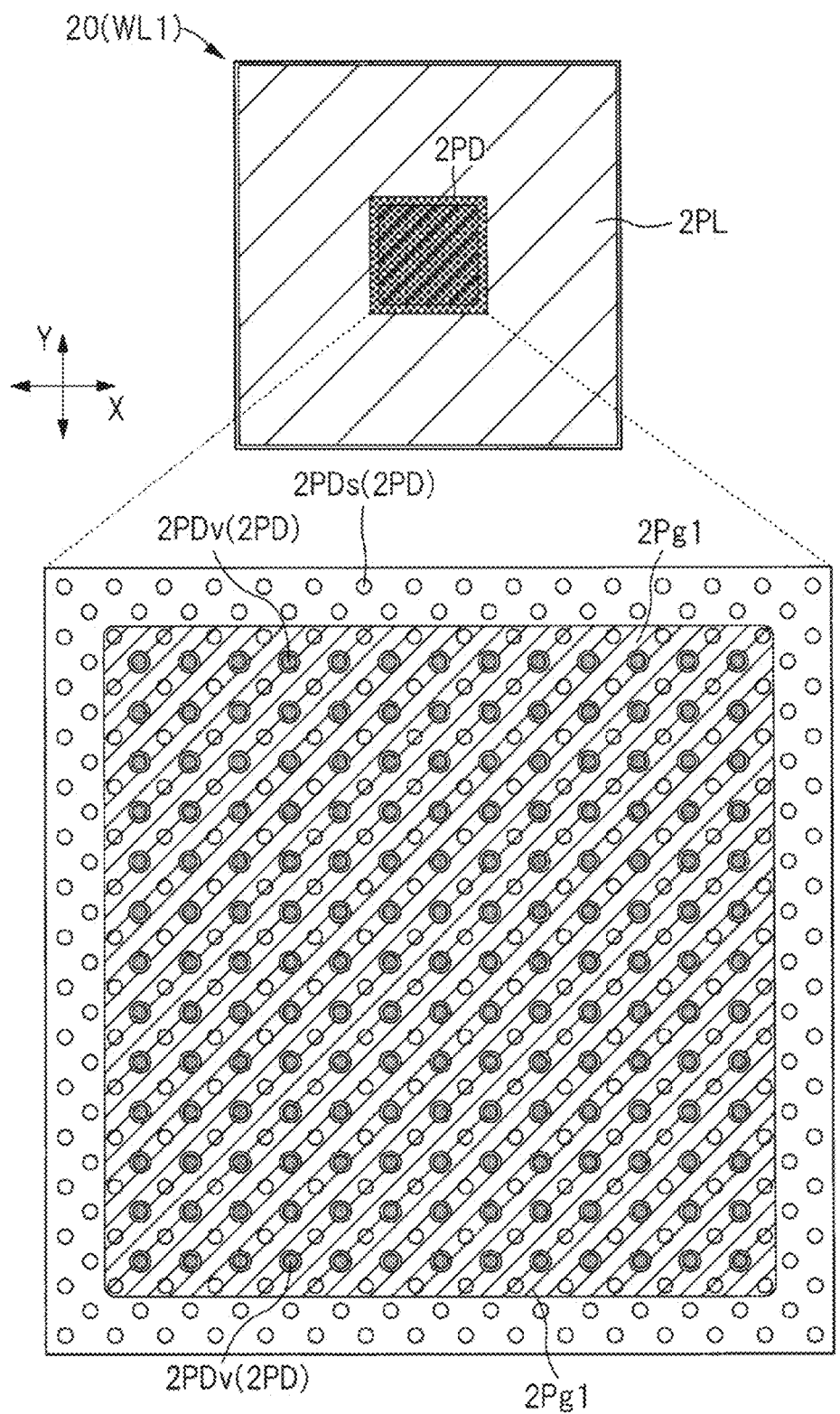
FIG. 8 is a plan view showing an example of the layout of the first wiring layer in which the insulating film of the uppermost layer is removed in the wiring substrate shown in FIG. 7.
Figure 9:
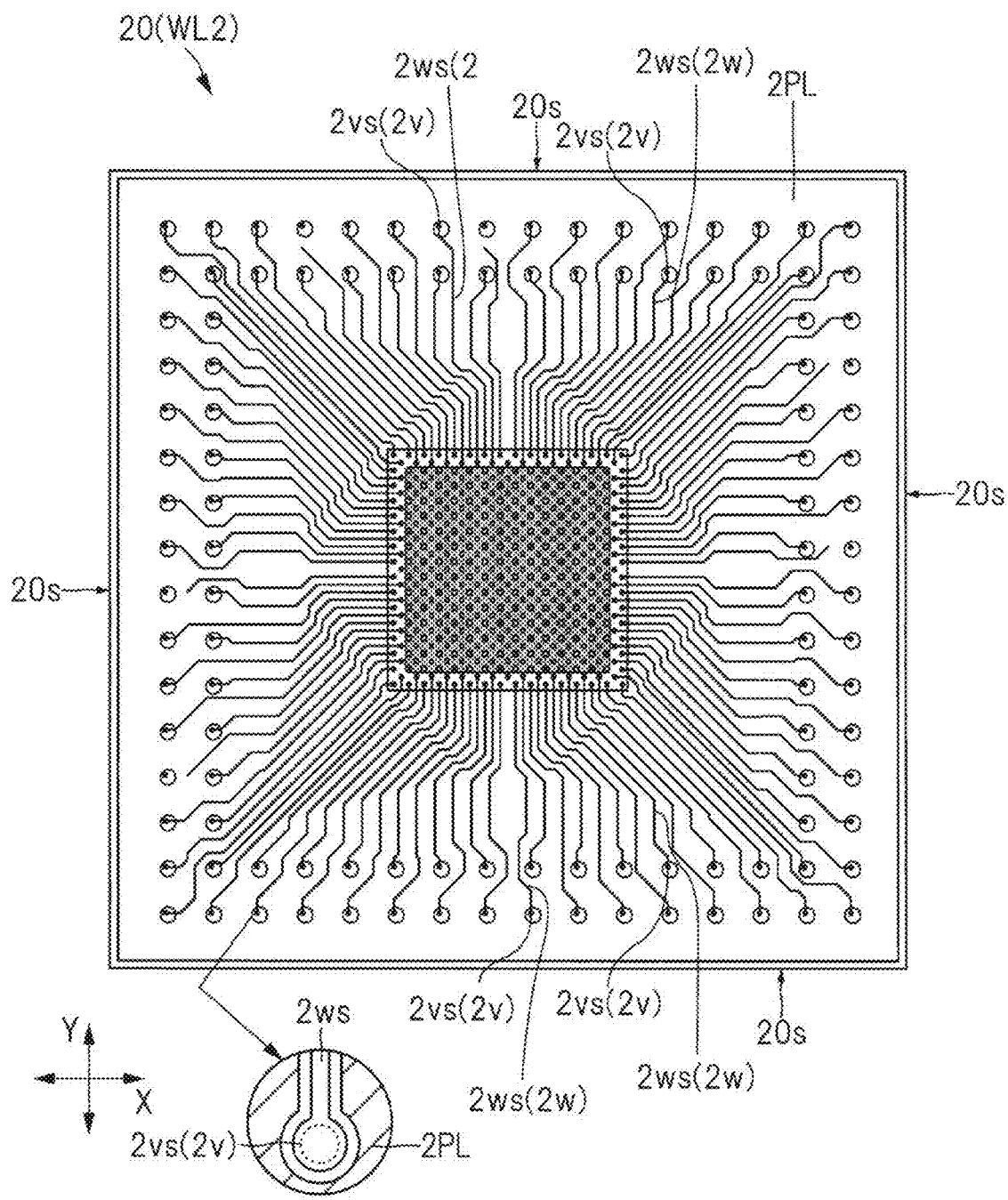
FIG. 9 is a plan view showing an example of the layout of the second wiring layer in the wiring substrate shown in FIG. 7.
Figure 10:
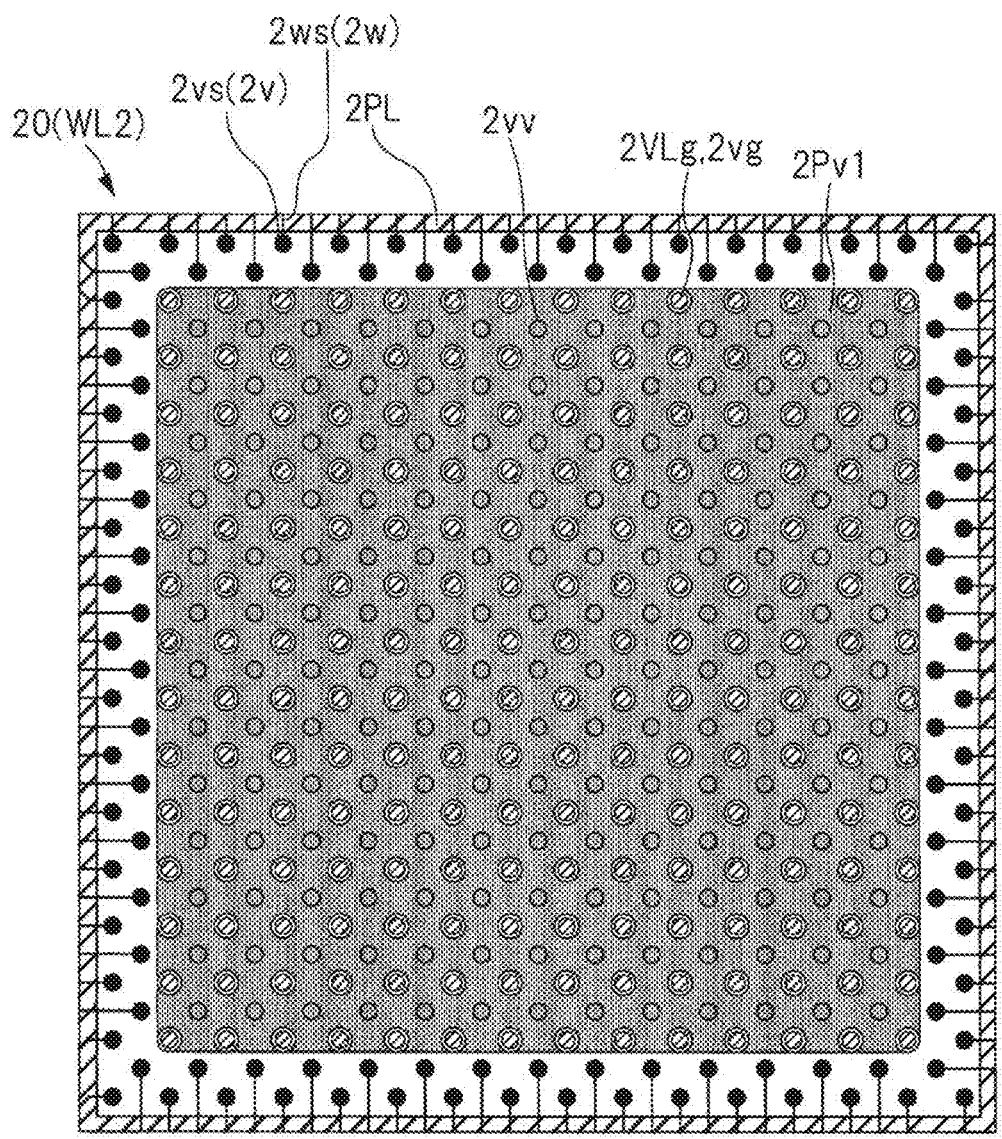
FIG. 10 is an enlarged plan view of the central portion of the wiring layer shown in FIG. 9.
Figure 11:
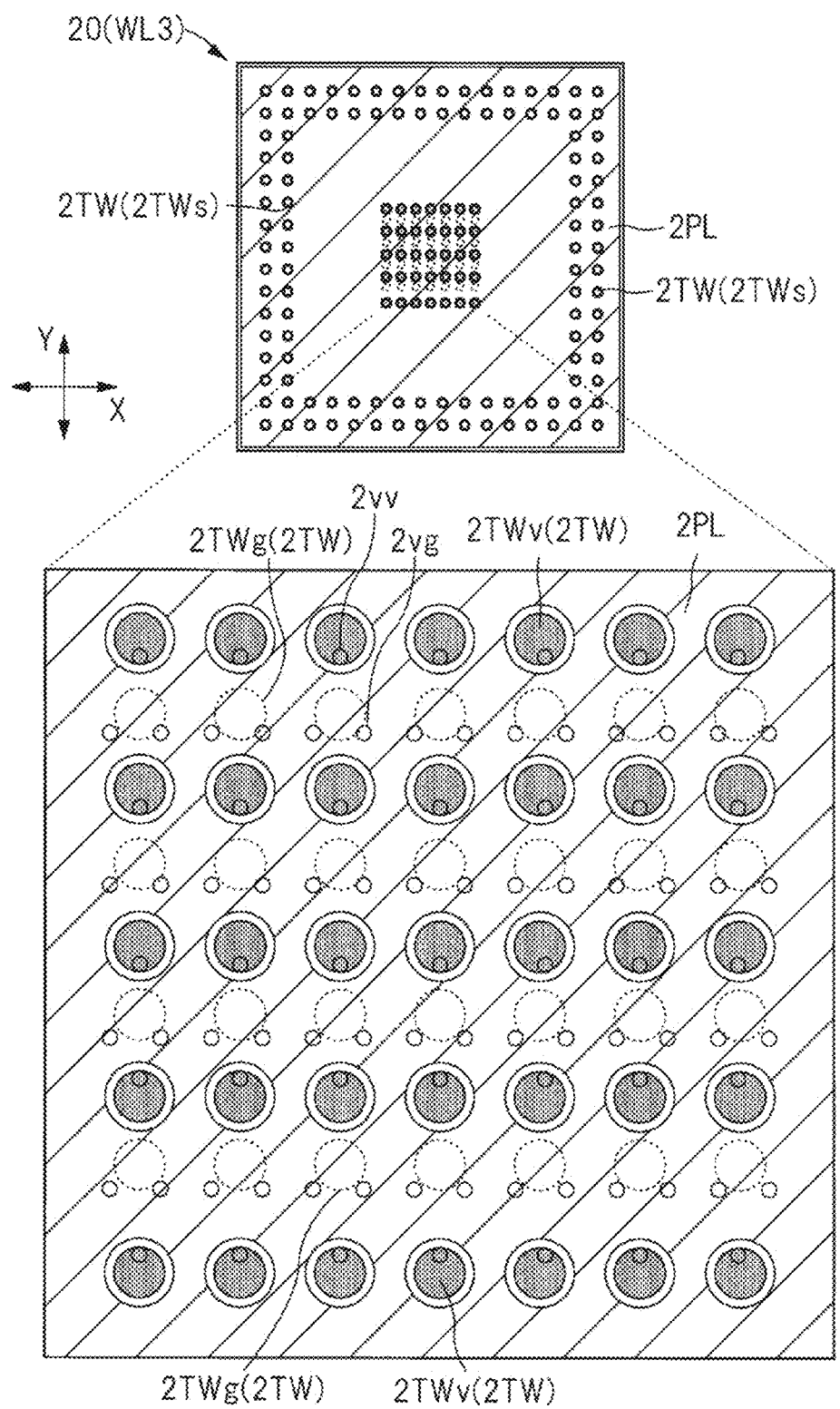
FIG. 11 is a plan view showing an example of the layout of the third wiring layer in the wiring substrate shown in FIG. 7.
Figure 12:
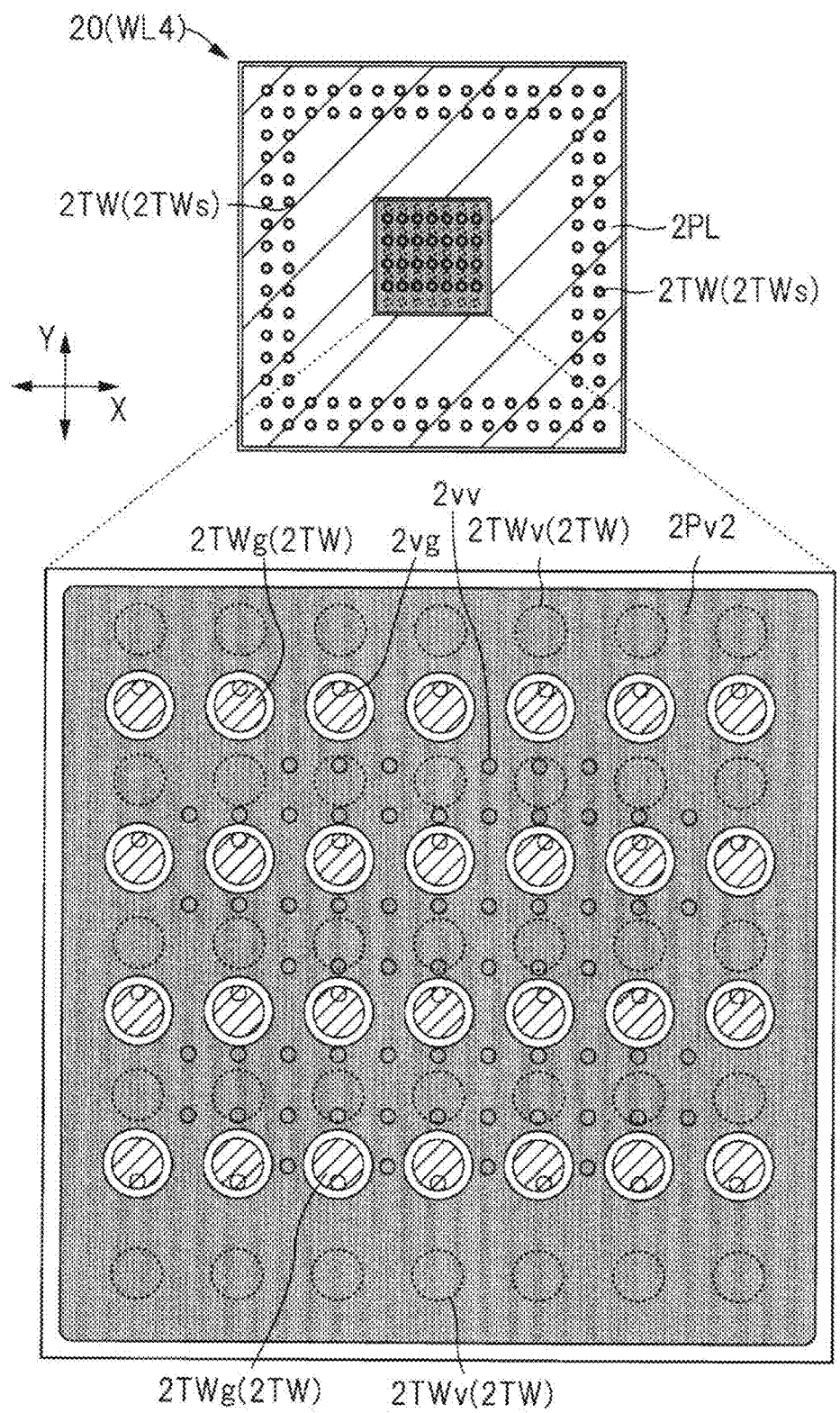
FIG. 12 is a plan view showing an example of the layout of the fourth wiring layer in the wiring substrate shown in FIG. 4.
Figure 13:
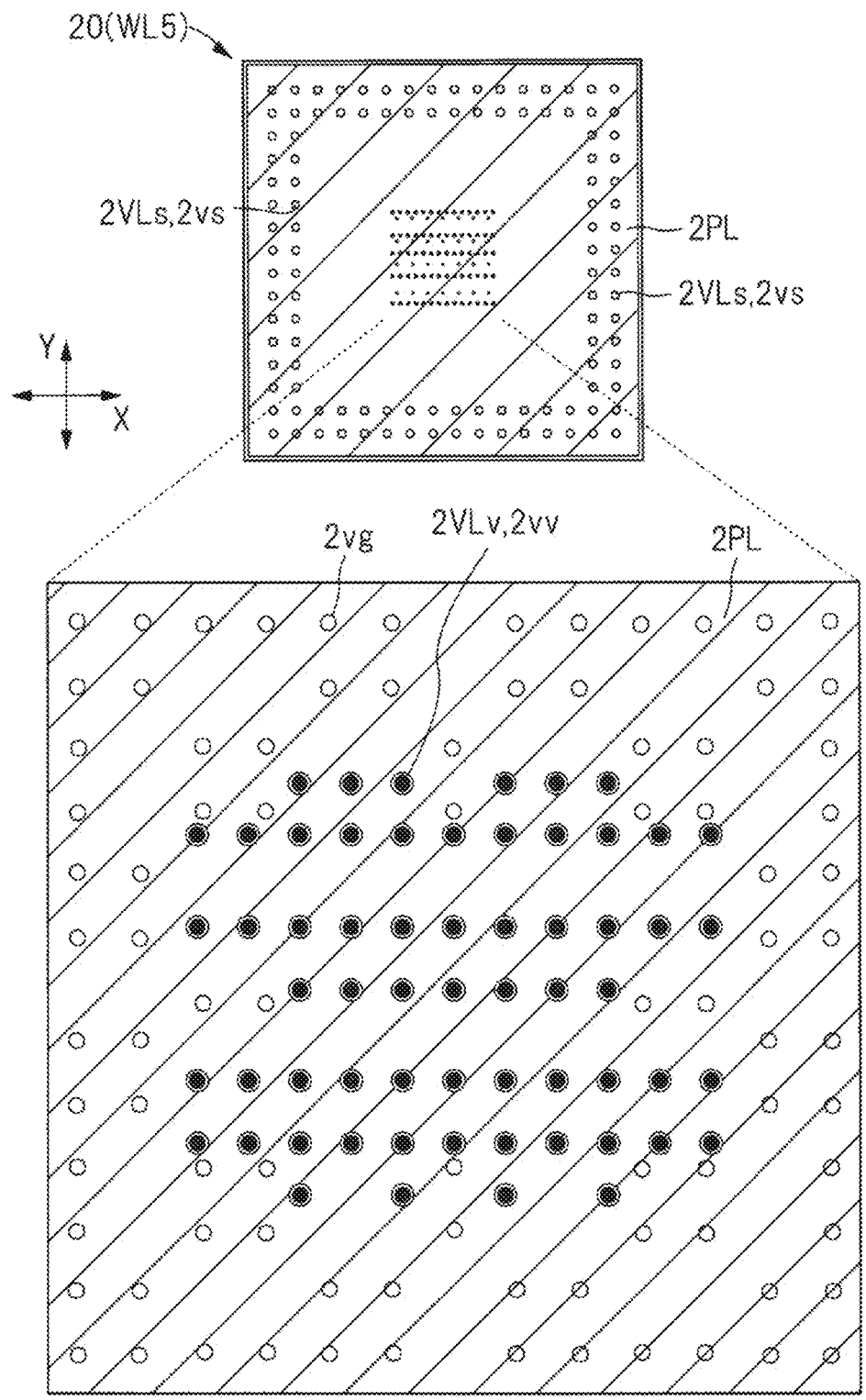
FIG. 13 is a plan view showing an example of the layout of the wiring layer of the fifth layer in the wiring substrate shown in FIG. 4.
Figure 14:
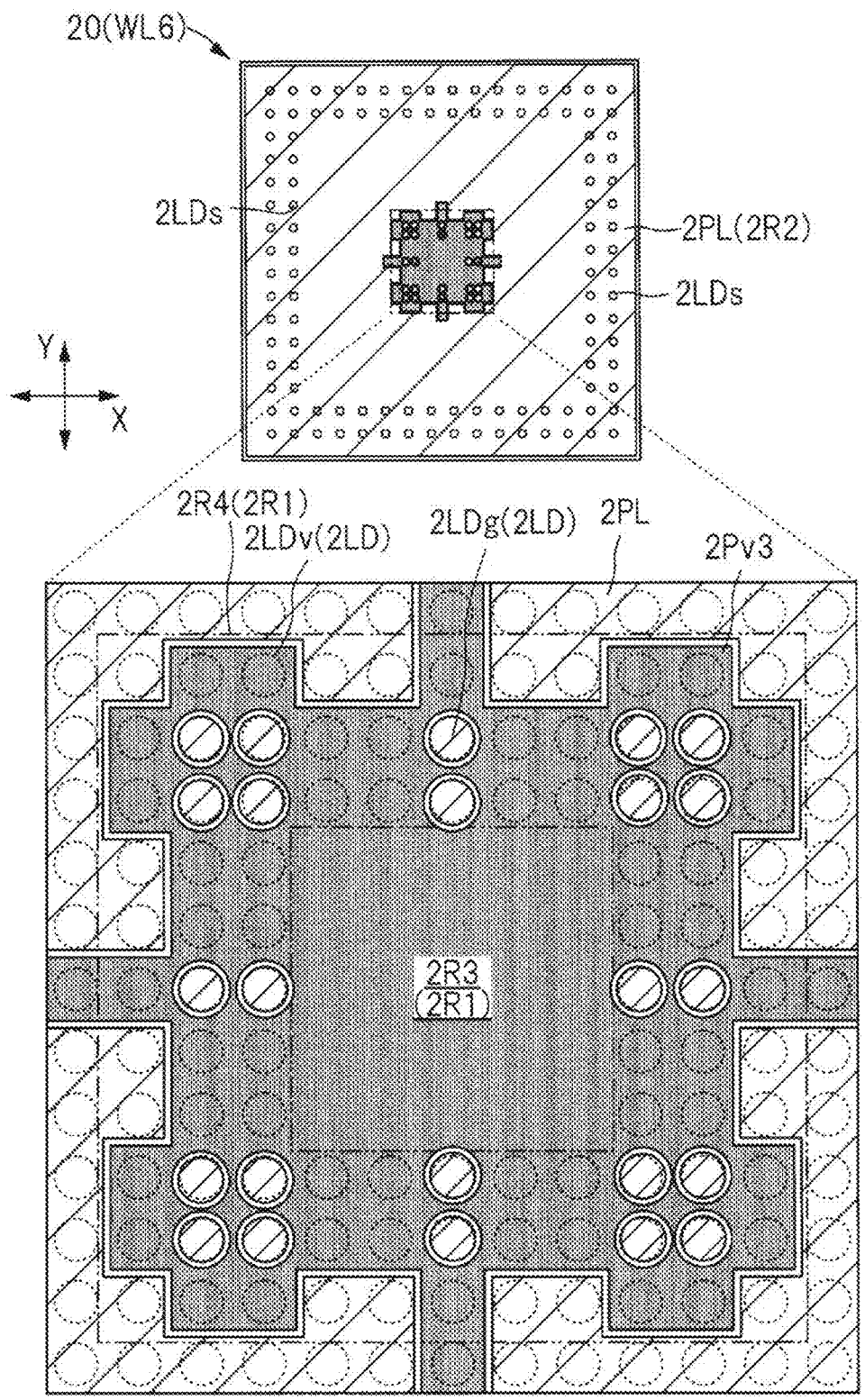
FIG. 14 is a plan view showing an example of the layout of the sixth wiring layer in the wiring substrate shown in FIG. 4.

<Details of wiring layout> Next, the wiring layout in each wiring layer of the wiring substrate 20 shown in FIG. 4 will be described in detail with reference to the drawings. FIG. 7 is a plan view showing a state in which the semiconductor chip and the underfill resin are removed from the upper surface of the wiring substrate shown in FIG. 2. FIG. 8 is a plan view showing an example of the layout of the first wiring layer in which the insulating film of the uppermost layer is removed in the wiring substrate shown in FIG. 7. In FIGS. 7 and 8, an area overlapping with the chip mounting area shown in FIG. 7 is shown in an enlarged manner. FIG. 9 is a plan view showing an example of the layout of the second wiring layer in the wiring substrate shown in FIG. 7. FIG. 10 is an enlarged plan view of the central portion of the wiring layer shown in FIG. 9. FIG. 11 is a plan view showing an example of the layout of the third wiring layer in the wiring substrate shown in FIG. 7. FIG. 12 is a plan view showing an example of the layout of the fourth wiring layer in the wiring substrate shown in FIG. 4. FIG. 13 is a plan view showing an example of the layout of the wiring layer of the fifth layer in the wiring substrate shown in FIG. 4. FIG. 14 is a plan view showing an example of the layout of the sixth wiring layer in the wiring substrate shown in FIG. 4. Each of FIGS. 7 to 14 is a plan view, but in order to distinguish the signal transmission path, the supply path of the power supply potential, and the supply path of the reference potential, patterns similar to those of FIG. 6 are added. That is, in FIGS. 7 to 10, the signal transmission path is indicated by an outline, the supply path of the power supply potential is indicated by a dot pattern, and the supply path of the reference potential is indicated by hatching. In FIG. 3 described above, dot patterns or hatching are attached only to the region 2R1 and its periphery in accordance with the same rules as in FIGS. 6 to 14.

In the semiconductor device PKG1, the semiconductor chip 10 and the wiring substrate 20 are electrically connected by a flip-chip connecting method. That is, as shown in FIG. 4, the front surface 10t of the semiconductor chip 10 faces the upper surface 20t of the wiring substrate 20. The plurality of electrode 1PD of the semiconductor chip 10 is arranged in opposition to each of the plurality of terminal 2PD of the wiring substrate 20 and is connected to each other through the protrusive electrode SB. By applying the flip-chip connection method in this manner, the conductive path for electrically connecting the semiconductor chip 10 and the wiring substrate 20 is shortened. Thus, the impedance of the conductive path can be reduced.

As can be seen by comparing FIG. 7 and FIG. 8, most of the uppermost wiring layer WL1 of the wiring substrate 20 is covered with the insulating film 2e1. The insulating film 2e1 is an organic insulating film protecting the upper surface 20t of the wiring substrate 20. The insulating film 2e1 is provided with a plurality of opening portions, and in each of the plurality of opening portions, a portion of the conductive patterns in the lower layer of the insulating film 2e1 is exposed. The portions of the plurality of opening portions exposed from the insulating film 2e1 are the terminal 2PD of the wiring substrate 20.

The plurality of terminals 2PD shown in FIG. 7 is disposed at positions facing the plurality of electrodes 1PD of the semiconductor chip 10 shown in FIG. 6. On the upper surface 20t of the wiring substrate 20, a plurality of opening portions is formed in a chip mounting region 10r which is a region overlapping with the semiconductor chip 10. On the upper surface 20t of the wiring substrate 20, the plurality of terminals 2PD is arranged in the chip-mounting area 10r. The plurality of terminals 2PD of the wiring substrate 20 includes a plurality of terminals 2PDs, a plurality of terminals 2PDv, and a plurality of terminals 2PDg.

The plurality of terminals 2PDs, the plurality of terminals 2PDv, and the plurality of terminals 2PDg are regularly arranged on the upper surface 20t of the wiring substrate 20. The plurality of terminals 2PDv and the plurality of terminals 2PDg are arranged in the center portion of the chip mounting area 10r on the upper surface 20t in the largest number. On the other hand, the plurality of terminals 2PDs is arranged most on the outer periphery of the chip-mounting area 10r on the upper surface 20t.

More specifically, each of the plurality of terminals 2PDs is arranged on the outermost circumference and on the inner circumference of one of the outermost circumferences among the arrangement of the plurality of terminals 2PD. In the upper surface 20t of the wiring substrate 20, the path distance of the signal transmission path can be shortened by arranging a plurality of terminal 2PDs transmitting the electrical signal SIG (see FIG. 5) on the outer circumference.

Each of the plurality of terminals 2PDs is electrically connected to a plurality of via wirings 2vs arranged on the outer periphery of the wiring substrate 20 via a plurality of wirings 2ws provided on the wiring layers WL2 shown in FIG. 9. In the wiring layers WL2, the conductive planes 2PL are arranged and the via wirings 2vs. The wiring 2ws and the via wiring 2vs overlap with the conductive plane 2PL formed in the wiring layers WL1 shown in FIG. 8. The plurality of via wirings 2vs is electrically connected to the through-hole wirings 2TWs for transmitting signals shown in FIG. 4.

Each of the plurality of through-hole wiring 2TWs is positioned at a position that does not overlap the semiconductor chip 10 (the periphery region of the wiring substrate 20).

As shown in FIG. 7, each of the plurality of terminals 2PDv and the plurality of terminals 2PDg is arranged inside the plurality of terminals 2PDs on the upper surface 20t. In other words, the plurality of terminals 2PDs is arranged between the plurality of terminals 2PDv and the plurality of terminals 2PDg and the outer edge of the upper surface 20t. With the semiconductor chip 10 illustrated in FIG. 1 mounted on the wiring substrate 20, the core circuit 12 (see FIG. 5) overlaps with a plurality of terminal 2PDv and portions where a plurality of terminal 2PDg is arranged. As shown in FIG. 4, the electrodes 1PD of the semiconductor chip 10 and the terminals 2PD of the wiring substrate 20 are connected to each other via the protrusive electrodes SB. Therefore, since the plurality of terminals 2PDv and the plurality of terminals 2PDg overlap with the core circuit 12, the power supply path to the core circuit 12 can be shortened.

As a result, it is possible to reduce loss and noise when power is supplied to the core circuit 12.

Each of the plurality of terminals 2PDv shown in FIG. 7 is a part of the terminal 2PDv arranged in the first wiring layer WL1 shown in FIG. 8. Similarly, each of the plurality of terminals 2PDg shown in FIG. 7 is a part of the conductive patterns 2Pg1 arranged in the first wiring layer WL1 shown in FIG. 8. Each of the plurality of terminals 2PDv and the conductive patterns 2Pg1 is disposed at a position overlapping with the semiconductor chip 10 shown in FIG. 1. In the wiring layers WL1, the conductive planes 2PL are arranged around the regions overlapping with the semiconductor chips 10, as shown in FIG. 1. The conductive plane 2PL is a conductive pattern having a large area as compared with the wiring 2w. The conductive plane 2PL is supplied with a grounding potential, for example. As shown in FIG. 4, in the wiring substrate 20 of the semiconductor device PKG1, the signal-transmitting wiring 2ws is arranged on the wiring layer WL2 and overlaps with the conductive plane 2PL provided on the wiring layer WL1. In this manner, when the wiring 2ws for signal transmission overlaps with the large-area conductive pattern to which the fixed potential is supplied, electromagnetic noise can be shielded. Since the wiring (signal wiring) 2ws is drawn out to the outside of the region overlapping with the semiconductor chip 10, by arranging the conductive plane 2PL in the region not overlapping with the semiconductor chip 10 in the wiring layers WL1, most of the wiring 2ws overlaps with the conductive plane 2PL.

As shown in FIG. 8, in the wiring layer WL1, a plurality of terminal 2PDs, conductive pattern 2Pg1, and a plurality of terminal 2PDv are disposed in an area overlapping the semiconductor chip 10 (see FIG. 4). The plurality of terminals 2PDs is arranged around an area where the plurality of conductive patterns 2Pg1 and the plurality of terminals 2PDv are arranged, and are electrically connected to the wiring layers WL2 through vias 2vs (see FIG. 4) for transmitting signals. The power supply potential VD shown in FIG. 5 is supplied to each of the plurality of terminals 2PDv. The reference potential VG shown in FIG. 5 is supplied to each of the plurality of conductive patterns 2Pg1.

In the embodiment shown in FIG. 8, the conductive patterns 2Pg1 are separated from the conductive plane 2PL. However, when the same potential is supplied to the conductive plane 2PL and the conductive pattern 2Pg1, as a modification to FIG. 8, the conductive pattern 2Pg1 and the conductive plane 2PL may be connected via a conductive member (for example, a wire pattern) (not shown). In this instance, the conductive members connecting the conductive patterns 2Pg1 and the conductive planes 2PL are disposed between the plurality of terminals 2PDs. When the distances between the terminals 2PDs adjacent to each other are small and spaces for arranging the conductive members cannot be secured between the terminals 2PDs, the conductive patterns 2Pg1 and the conductive planes 2PL may be separated as shown in FIG. 8.

As shown in FIG. 10, the wiring layers WL2 have conductive patterns 2Pv1 to which the power supply potential VD is supplied. The conductive pattern 2Pv1 has the same area as that of the conductive pattern 2Pg1 shown in FIG. 8, and overlaps with a plurality of terminals 2PDv. The conductive pattern 2Pv1 is electrically connected to each of the plurality of terminal 2PDv via the via wiring 2vv (see FIG. 4). If a large area conductive pattern 2Pv1 is connected to a plurality of terminal 2PDv shown in FIG. 8, the power supply to the core circuit 12 (see FIG. 5) can be stabilized.

For example, when the power demand instantaneously increases in a part of the plurality of terminals 2PDv, a large current can flow through the conductive patterns 2Pv1. Similarly, the conductive pattern 2Pg1 shown in FIG. 8 is a conductive pattern having a large area, and for example, even if the power demand instantaneously increases in a part of the conductive pattern 2Pg1, the instantaneous variation of the reference potential can be suppressed.

The wiring layers WL2 include a plurality of via lands (conductive patterns) 2VLg to which the reference potential VG (see FIG. 5) is supplied. Each of the plurality of via lands 2VLg is arranged at a position overlapping with the conductive patterns 2Pv1 shown in FIG. 8. A plurality of opening portions is formed in the conductive pattern 2Pv1, and each of the plurality of via lands 2VLg is arranged in an opening portion provided in the conductive pattern 2Pv1 and is separated from the conductive pattern 2Pv1. Each of the plurality of via lands 2VLg is electrically connected to the conductive patterns 2Pg1 shown in FIG. 8 through via wirings 2vg.

A plurality of wirings 2ws is formed in the wiring layers WL2. One end portion of the wiring 2ws is arranged in a region overlapping with the chip mounting region 10r shown in FIG. 7, and is connected to the via wiring 2vs in a region overlapping with the chip mounting region 10r. The plurality of via wirings 2vs arranged in the region overlapping with the chip-mounting region 10r is connected to the plurality of terminals 2PDs shown in FIGS. 7 and 8. The other end of the wiring 2ws is connected to the via wiring 2vs arranged in a region not overlapping with the chip mounting region 10r. The via wiring 2vs arranged in the region not overlapping with the chip-mounting region 10r is connected to the through-hole wiring 2TWs of the wiring layers WL3 shown in FIG. 11. The plurality of wirings 2ws extend from a region overlapping with the chip-mounting region 10r toward the outer periphery of the wiring layers WL2. The input/output terminals of the electric signals SIG (see FIG. 5) between the semiconductor device PKG1 and the external device are a plurality of lands 2LDs shown in FIG. 14. The plurality of lands 2LDs is arranged in the region 2R2 and are not arranged in the region 2R1. In the wiring layers WL4, the wiring layers WL5, and the wiring layers WL6 shown in FIG. 4, the signal transmission paths are not arranged in regions overlapping with the semiconductor chips 10.

In the wiring layers WL2, each of the plurality of signal transmission paths is led out of a region overlapping with the chip-mounting region 10r shown in FIG. 7. Therefore, in each of the wiring layers WL3, the WL4, the WL5, and the WL6 shown in FIG. 4, the signal transmission path is not arranged in the region overlapping with the semiconductor chip 10, and the conductive pattern to which the power supply potential VD (see FIG. 5) is supplied or the conductive pattern to which the reference potential VG (see FIG. 5) is supplied is arranged.

In the wiring layers WL2, the plurality of wirings 2ws is arranged between the conductive planes 2PL. The plurality of wirings 2ws is sandwiched between the conductive planes 2PL of the wiring layer WL1 and the conductive planes 2PL of the wiring layer WL3 in the thickness directions of the wiring substrate 20. The conductive planes 2PL arranged in the respective wiring layers are electrically connected to each other, and are supplied with a reference potential VG (see FIG. 5). That is, each of the plurality of wirings 2ws, which is a signal-transmission path arranged in the wiring layers WL2, has a strip-line configuration. By making the wiring structure of the signal transmission path a strip line structure, it is possible to reduce the influence of noise on the signal transmission path. As a modification to the present embodiment, there may be a microstrip line configuration in which the conductive plane 2PL is arranged in one of the wiring layer WL1 and the wiring layer WL3, and is not arranged in the other.

The wiring substrate 20 has the wiring layers WL3 shown in FIG. 11. As shown in FIG. 4, the wiring layer WL3 is between the wiring layer WL2 and the lower surface 20b, and is adjacent to the wiring layer WL2 in a cross-sectional view crossing the upper surface 2t.

The wiring layers WL3 have a plurality of through-hole wirings 2TW. The plurality of through-hole wirings 2TW includes a plurality of through-hole wirings 2TWv to which the power supply potential VD (see FIG. 5) is supplied, a plurality of through-hole wirings 2TWg to which the reference potential VG (see FIG. 5) is supplied, and a plurality of through-hole wirings 2TWs connected to the signal transmission path. The through-hole wiring 2TWg is formed integrally with the conductive plane 2PL, and is electrically connected to each of the plurality of via lands 2VLg shown in FIG. 10 via the via wiring 2vg. A plurality of opening portions is formed in the conductive plane 2PL. A plurality of through-hole wirings 2TWv and a plurality of through-hole wirings 2TWs is arranged in the plurality of opening portions of the conductive plane 2PL so as to be separated from the conductive plane 2PL, respectively. Each of the plurality of through-hole wirings 2TWv is electrically connected to the conductive patterns 2Pv1 shown in FIG. 10 via the via wirings 2vv.

The wiring substrate 20 has the wiring layers WL4 shown in FIG. 12. As shown in FIG. 4, the wiring layer WL4 is between the wiring layer WL3 and the lower surface 20b, and is adjacent to the wiring layer WL3 in a cross-sectional view crossing the upper surface 2t. The wiring layer WL4 is a wiring layer disposed on the other side of the wiring layer WL3 through the insulating layer 2CR which is a core insulating layer. As shown in FIG. 12, the wiring layer WL4 has a conductive pattern 2Pv2 disposed at a position overlapping the semiconductor chip 10 (see FIG. 4).

The conductive pattern 2Pv2 has an area similar to the chip mounting region 10r illustrated in FIG. 7 and is spaced apart from the surrounding conductive plane 2PL.

The wiring layers WL4 have a plurality of through-hole wirings 2TW. The plurality of through-hole wirings 2TW includes a plurality of through-hole wirings 2TWv to which the power supply potential VD (see FIG. 5) is supplied, a plurality of through-hole wirings 2TWg to which the reference potential VG (see FIG. 5) is supplied, and a plurality of through-hole wirings 2TWs connected to the signal transmission path. The through-hole wirings 2TWv are formed integrally with the conductive patterns 2Pv2, and are electrically connected to the plurality of through-hole wirings 2TWv on the WL3 sides of the wiring layers shown in FIG. 11. A plurality of opening portions is formed in the conductive pattern 2Pv2. A plurality of through-hole wirings 2TWg is arranged in the plurality of opening portions of the conductive pattern 2Pv2 so as to be separated from the conductive pattern 2Pv2. Each of the plurality of through-hole wirings 2TWg is electrically connected to the conductive plane 2PL shown in FIG. 11.

The wiring substrate 20 has the wiring layers WL5 shown in FIG. 13. As shown in FIG. 4, the wiring layer WL5 is between the wiring layer WL4 and the lower surface 20b, and is adjacent to the wiring layer WL4 in a cross-sectional view crossing the upper surface 2t. As shown in FIG. 13, the wiring layer WL5 has a conductive plane 2PL to which a reference potential VG (see FIG. 5) is supplied. The conductive plane 2PL extends from areas overlapping the semiconductor chip 10 (see FIG. 4) to areas not overlapping the semiconductor chip 10. The conductive plane 2PL is electrically connected to each of the plurality of through-hole wiring 2TWg shown in FIG. 12 via the via wiring 2vg shown in FIG. 12. As shown in FIG. 13, a plurality of opening portions is formed in the conductive plane 2PL. A via land 2VLv is disposed in the plurality of opening portions. Each of the plurality of via lands 2VLv is separated from the conductive plane 2PL. The plurality of via lands 2VLv is electrically connected to the conductive patterns 2Pv2 shown in FIG. 12 through via wirings 2vv shown in FIG. 12.

The wiring substrate 20 has the wiring layers WL6 shown in FIG. 14. As shown in FIG. 4, the wiring layer WL6 is a lowermost wiring layer in which a plurality of lands 2LD is formed. The wiring layers WL6 have conductive patterns 2Pv3 disposed at positions overlapping with the semiconductor chips 10, as shown in FIG. 4. The conductive pattern 2Pv3 has an area similar to the chip mounting region 10r illustrated in FIG. 7 and is spaced apart from the surrounding conductive plane 2PL. The planar shape of the conductive patterns 2Pv3 is not a simple square, but a polygonal shape corresponding to the layouts of the land 2LDv for power supply and the land 2LDg for reference potential supply on the mounting surface of the semiconductor device PKG1. A plurality of opening portions is formed in the conductive pattern 2Pv. A plurality of lands 2LDg is arranged in the plurality of opening portions of the conductive pattern 2Pv3 so as to be separated from the conductive pattern 2Pv3. Each of the plurality of lands 2LDg is electrically connected to the conductive plane 2PL via the via wire 2 vg shown in FIG. 13.

As shown in FIG. 14, the conductive patterns 2Pv3 and the conductive planes 2PL are arranged in regions 2R1 overlapping with the semiconductor chips 10 in the wiring layers WL6. The area of the conductive patterns 2Pv3 in the area 2R1 is greater than the area of the conductive plane 2PL. The driving voltage for driving the core circuit 12 shown in FIG. 5 is a potential difference between the power supply potential VD and the reference potential VG. However, the reference potential VG is used in many applications other than the driving voltage of the core circuit 12. For example, it is used as a driving voltage of the input/output circuit 11 of the semiconductor chip 10 or as a reference potential of the electric signal SIG. Therefore, as shown in FIG. 14, the conductive plane 2PL to which the reference potential VG is supplied has the largest area among the plurality of conductive patterns arranged in the wiring layers WL6. Therefore, the transmission path of the reference potential VG can be easily stabilized. Therefore, it is preferable to preferentially arrange the conductive patterns 2Pv3 as the supply paths of the power supply potentials VD in the regions 2R1 overlapping with the semiconductor chips 10. In the embodiment shown in FIG. 14, the region 2R4 which is in the center portion of the region 2R1 and in which the land 2LD is not arranged is covered with the conductive patterns 2Pv3, and the conductive plane s 2PL are not arranged.

As can be seen by comparing FIG. 3 and FIG. 14, the wiring layer WL6 of the lowermost layer of the wiring substrate 20 is largely covered with the insulating film 2e2. The insulating film 2e2 is an organic insulating film (solder resist film) for protecting the lower surface 20b (see FIG. 3) of the wiring substrate 20. The insulating film 2e2 is provided with a plurality of opening portions, and in each of the plurality of opening portions, a part of the conductive pattern (such as the conductive pattern 2Pv3 or the conductive plane 2PL) in the lower layer of the insulating film 2e2 is exposed. The portions of the plurality of opening portions exposed from the insulating film 2e2 are the land 2LD of the wiring substrate 20. As described with reference to FIGS. 3 and 4, solder balls as external terminals 30 of the semiconductor device PKG1 are respectively connected to the plurality of lands 2LD.

Figure 15:
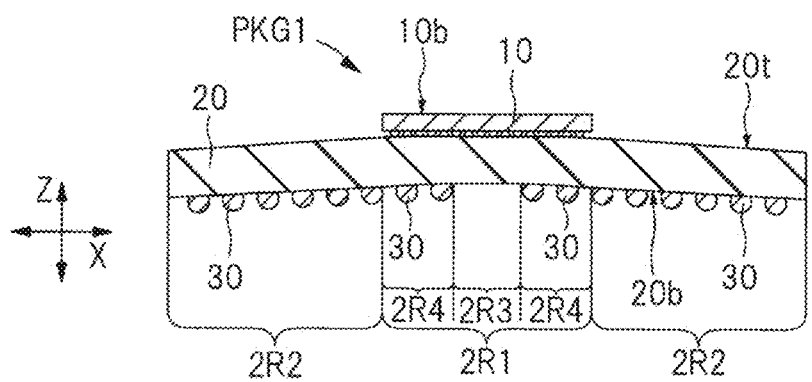
FIG. 15 is a cross-sectional view showing a model of warp deformation of the wiring substrate shown in FIG. 4.
Figure 16:
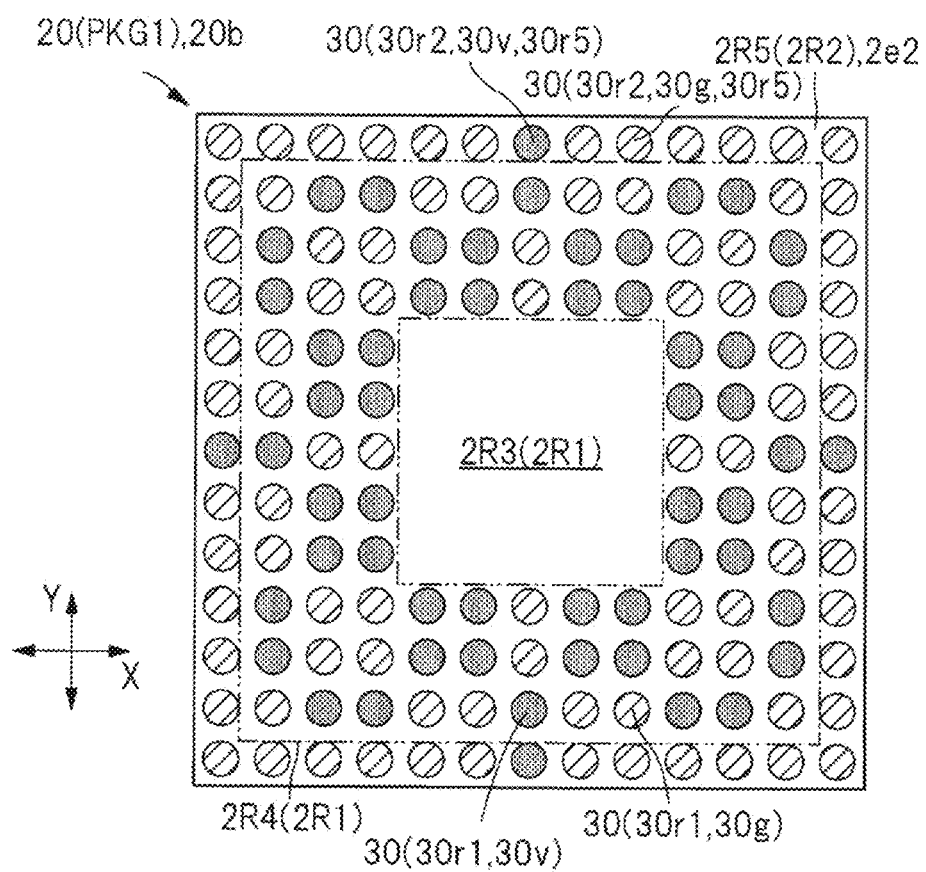
FIG. 16 is an enlarged plan view of the periphery of the central portion of the wiring substrate shown in FIG. 3.

<Details of terminal layout> Next, the terminal layout of the semiconductor device PKG1 will be described in detail. FIG. 15 is a cross-sectional view showing a model of warp deformation of the wiring substrate shown in FIG. 4. FIG. 16 is an enlarged plan view of the periphery of the central portion of the wiring substrate shown in FIG. 3. In semiconductor packages in which the semiconductor chip 10 is mounted on the wiring substrate 20 as in the semiconductor device PKG1, warpage and deformation of the wiring substrate 20 tend to occur due to the difference between the coefficient of linear expansion of the wiring substrate 20 and the coefficient of linear expansion of the semiconductor chip 10. The manufacturing process of the semiconductor device PKG1 includes various heat processes such as a die bonding process of mounting the semiconductor chips 10 on the wiring substrate 20, a curing process of thermally curing the underfill resin 40 (see FIG. 4), and a ball mounting process of bonding the external terminals 30 to the land 2LD (see FIG. 4). In addition, after the semiconductor device PKG1 is completed, when the semiconductor device is mounted on the mounting substrate 50 shown in FIG. 20, which will be described later, heat treatment is performed in order to join the external terminals 30 to the terminals of the mounting substrate 50, i.e., the upper surface terminals 51 shown in FIG. 20. For this reason, as illustrated in FIG. 15, it is important to take measures for the case where warpage deformation occurs on the premise that warpage deformation occurs in the wiring substrate 20.

As shown in FIGS. 3 and 15, the lower surface 20b of the wiring substrate 20 includes a region 2R1 overlapping with the semiconductor chip 10 (see FIG. 15) mounted on the upper surface 20t (see FIG. 15), and a region 2R2 surrounding the region 2R1 and not overlapping with the semiconductor chip 10. The region 2R1 includes a region 2R3 in which the plurality of external terminals 30 is not arranged, and a region 2R4 surrounding the region 2R3 in which the plurality of external terminals 30 is arranged.

When the semiconductor chip 10 is connected to the wiring substrate 20 by the flip-chip connection method as in the present embodiment, the electrical connection portion between the semiconductor chip 10 and the wiring substrate 20 is firmly fixed.

For this reason, in the region overlapping the semiconductor chip 10 of the wiring substrate 20, the thermal expansion or thermal contraction is small, not overlapping the semiconductor chip 10, and in the remote region, the degree of thermal expansion or thermal contraction is large. Therefore, for example, when the back surface 10b of the semiconductor chip 10 shown in FIG. 15 is a reference surface, the region 2R3 of the bottom surface 20b of the wiring substrate 20 has the smallest difference in height from the back surface 10b, and the region 2R4 has the smallest difference in height from the back surface 10b after the region 2R3. Further, as the region 2R2 approaches the outer edge of the lower surface 2b, the difference in height from the back surface 10b becomes greater, and the difference in height from the back surface 10b becomes largest at the outer edge of the lower surface 2b.

When the plurality of external terminals 30 is simply arranged in a matrix on the lower surface 20b, the height of the respective tips of the external terminals 30 becomes large due to warpage deformation of the lower surface 20b of the wiring substrate 20. The degree of variation in the height of the external terminal 30 affects the uniformity (called coplanarity) of the flatness of the vertex of the external terminal 30 with respect to the mounting surface (mounting surface of the mounting substrate). When coplanarity is good, that is, when the heights of the vertices of the external terminals 30 are the same, each of the plurality of external terminals 30 can be electrically connected to the mounting substrate. On the other hand, when coplanarity is poor, in other words, when the height variation of the vertex of the external terminal 30 is large, there is a possibility that some of the plurality of external terminals 30 is not connected to the terminals of the mounting substrate. Alternatively, some of the plurality of external terminals 30 may be excessively crushed when connected to the terminals of the mounting board.

Therefore, in consideration of coplanarity of the plurality of external terminals 30, it is preferable that the external terminals 30 are not connected to the entire lower surface 20b of the wiring substrate 20, but a region to which the external terminals 30 are not connected exists. Of the arrangement of the external terminals 30 shown in FIG. 3, signal terminals to which the electrical signal SIG shown in FIG. 5 is transmitted are arranged on the outermost periphery. Therefore, if the number of the external terminals 30 arranged on the outermost periphery is reduced, the number of the signal terminals is reduced. Therefore, a method of providing a region in which the external terminals 30 are not arranged in a portion of the lower surface 20b of the wiring substrate 20 where the difference in height from the outer edge is particularly large is conceivable.

Here, as described above, the region 2R1 overlapping the semiconductor chip 10 (see FIG. 15) may have a structure in which the external terminal 30 is not disposed in the region 2R1 because the thermal expansion or thermal contraction is small and the height difference from the outer edge is large. However, in the region overlapping with the semiconductor chip 10, as described above, the conductive patterns 2Pv1 (see FIG. 10), 2Pv2 (see FIG. 12), and 2Pv3 (see FIG. 14) for supplying the power supply potential VD to the core circuit 12 shown in FIG. are arranged. Therefore, it has been found that in the configuration in which the external terminal 30 is not disposed in the region 2R1, the supply path of the power supply potential VD is extremely small, and stable power supply to the core circuit 12 becomes difficult.

Therefore, as shown in FIG. 16, in the semiconductor device PKG1, the region 2R1 is divided into the region 2R3 and the region 2R4, and the external terminals 30 are arranged in the region 2R4. The plurality of external terminals 30 includes a plurality of terminals 30r1 arranged in the region 2R4 of the region 2R1 and a plurality of terminals 30r2 arranged in the region 2R2. The plurality of terminals 30r1 includes a plurality of power supply terminals 30v for supplying a power potential VD (see FIG. 5) to the core circuit 12 (see FIG. 5) of the semiconductor chip 10 (see FIG. 5) and a plurality of reference terminals 30g for supplying a reference potential VG (see FIG. 5) to the core circuit 12 of the semiconductor chip 10.

When the back surface 10b of the semiconductor chip 10 shown in FIG. 15 is a reference surface, the height from the back surface 10b to the region 2R4 of the bottom surface 20b is smaller than the height from the back surface 10b to the region 2R2 of the bottom surface 20b, and is greater than the height from the back surface 10b to the region 2R3 of the bottom surface 20b. Therefore, if the external terminals 30 are not arranged in the region 2R3, the height of the apexes of the external terminals 30 can be made uniform. In addition, since the plurality of power supply terminals 30v is arranged in the region 2R4 overlapping with the semiconductor chip 10, the driving voltages of the core circuits 12 can be stably supplied.

The number of the plurality of power supply terminals 30v arranged in the region 2R4 is greater than the number of the plurality of reference terminals 30g arranged in the region 2R4. As described with reference to FIG. 14, the reference potential VG shown in FIG. 5 is used in many applications other than the driving voltage of the core circuit 12. Therefore, many reference terminals 30g to which the reference potential VG is supplied are also arranged in the area 2R2 shown in FIG. 3. Among the plurality of external terminals 30, the number of reference terminals 30g is the largest. Therefore, a large number of supply paths of the reference potential VG can be secured. For this reason, it is preferable to preferentially arrange the power supply terminal 30v, which is a supply path of the power supply potential VD, in the area 2R1 overlapping with the semiconductor chip 10. In the example shown in FIG. 16, at the regional 2R4, the number of power supply terminals 30v is 52 and the number of reference terminals 30g is 44. However, there are various modified examples of the arrangement ratio of the power supply terminal 30v and the reference terminal 30g. These modified examples include the case where the number of the power supply terminals 30v and the number of the reference terminals 30g are the same, and the case where the number of the power supply terminals 30v is smaller than the number of the reference terminals 30g. From the viewpoint of increasing the number of supply paths of the power supply potential VD, as shown in FIG. 16, it is particularly preferable that the number of the power supply terminals 30v is greater than the number of the reference terminals 30g.

As shown in FIG. 16, the plurality of external terminals 30 disposed adjacent to the plurality of power supply terminals 30v includes one or more reference terminals 30g. When the supply path of the power supply potential VD and the supply path of the reference potential VG shown in FIG. 5 are arranged adjacent to each other, noise included in the power supply path can be reduced due to the influence of mutual inductance. In the example shown in FIG. 16, one or more reference terminals 30g are always disposed next to the power supply terminal 30v. Therefore, noise in the supply path of the power supply potential VD can be reduced.

As shown in FIG. 16, one or more power supply terminals 30v are included in a plurality of external terminals 30 disposed adjacent to each of the plurality of power supply terminals 30v. In other words, each of the plurality of power supply terminals 30v is arranged such that two or more power supply terminals 30v are adjacent to each other. When two or more power supply terminals 30v are arranged adjacent to each other, the cross-sectional area of the supply path of the power supply potential VD shown in FIG. 5 can be increased. In this case, the power supply potential VD can be stabilized as compared with the case where the power supply terminal 30v and the reference terminal 30g are alternately arranged one by one. In addition, although details will be described later, the power supply terminal 30v and the reference terminal 30g may be connected via a chip capacitor. In this case, in consideration of the arrangement space of the electrodes of the chip capacitor, it is preferable that two or more power supply terminals 30v are arranged adjacent to each other, and that two or more reference terminals 30g are arranged adjacent to each other.

As shown in FIG. 16, the region 2R2 includes a region 2R5 surrounding the region 2R4. The region 2R5 and the region 2R4 are adjacent to each other. In the region 2R5, a plurality of terminals 30r5 included in the plurality of external terminals 30 is arranged in a row so as to surround the periphery of the region 2R4. The plurality of terminals 30r5 includes a plurality of power terminals 30v and a plurality of reference terminals 30g.

As described above, in order to stably supply the power supply potential VD, the greater the number of the power supply terminals 30v arranged in the area 2R1, the better.

On the other hand, from the viewpoint of reducing noises or considering the ease of connecting the chip capacitors, a space for arranging the reference terminal 30g in the area 2R1 is also required. As shown in FIG. 16, when the power supply terminals 30v are arranged in the area 2R5, the number of the power supply terminals 30v arranged at positions connectable to the conductive patterns 2Pv3 shown in FIG. 14 can be increased.

<Region ratio of the region where external terminals are not arranged> Next, the examination result of the region ratio between the area 2R3 and the area 2R4 in the above-described area 2R1 will be described. In this study, how many external terminals 30 can be reduced from the largest number of external terminals 30 that can be arranged in the region 2R1 (or the region 2R1 and the region 2R5) shown in FIG. 16 within a range that satisfies the following two conditions was examined. The first condition is that the number of the plurality of power supply terminals 30v arranged in the region 2R4 is greater than the number of the plurality of reference terminals 30g arranged in the region 2R4. The second condition is that one or more power supply terminals 30v are included in a plurality of external terminals 30 disposed adjacent to each of the plurality of power supply terminals 30v. In the following, an arrangement pattern in which the ratio of the area of the region 2R3 to the area of the region 2R1 is the largest among the many arrangement patterns examined this time, in other words, the ratio of decreasing the number of external terminals 30 to the maximum number of external terminals 30 that can be arranged is the largest will be exemplarily described. Each of FIGS. 17 to 19 is an enlarged plan view showing a modification of the wiring substrate shown in FIG. 16.

Figure 17:
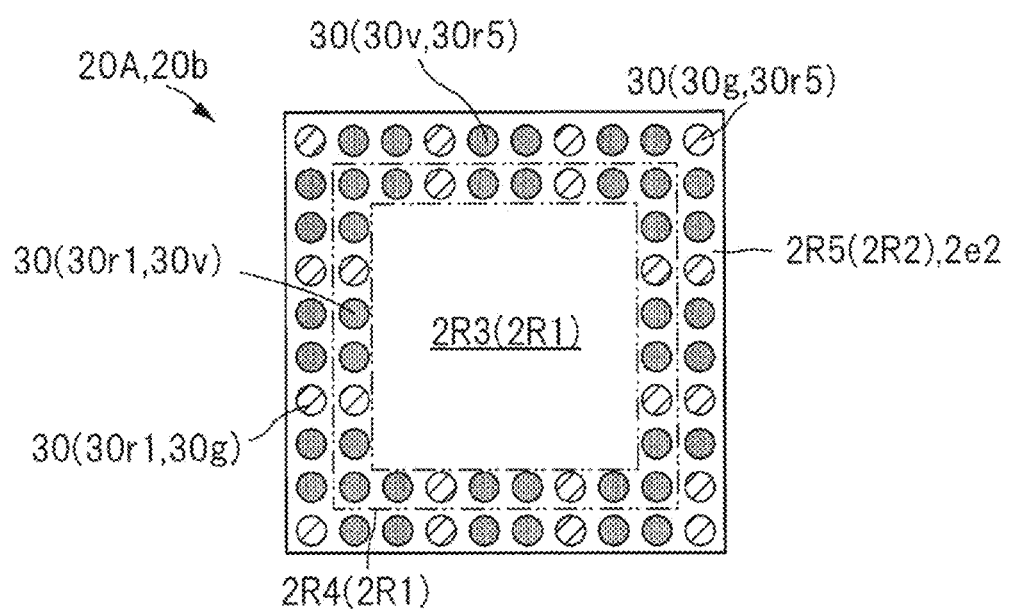
FIG. 17 is an enlarged plan view showing a modification of the wiring substrate shown in FIG. 16.

In the wiring substrate 20A shown in FIG. 17, up to 64 external terminals 30 (8 columns×8 rows) can be arranged in the region 2R1. On the other hand, the number of external terminals 30 arranged on the region 2R4 of the wiring substrate 20A is 28. Therefore, the area of the region 2R3 is 56.3% of the area of the region 2R1. In the wiring substrate 20A, the external terminals 30 are arranged in a row in the region 2R4, and the number of the power supply terminals 30v arranged in the region 2R4 is 20. In the wiring substrate 20A, twenty-four power supply terminals 30v are arranged in the area 2R5. When the number of the power supply terminals 30v arranged in the region 2R4 is insufficient as the area of the region 2R3 is increased, the insufficient number can be compensated by arranging the power supply terminals 30v in the region 2R5.

Figure 18:
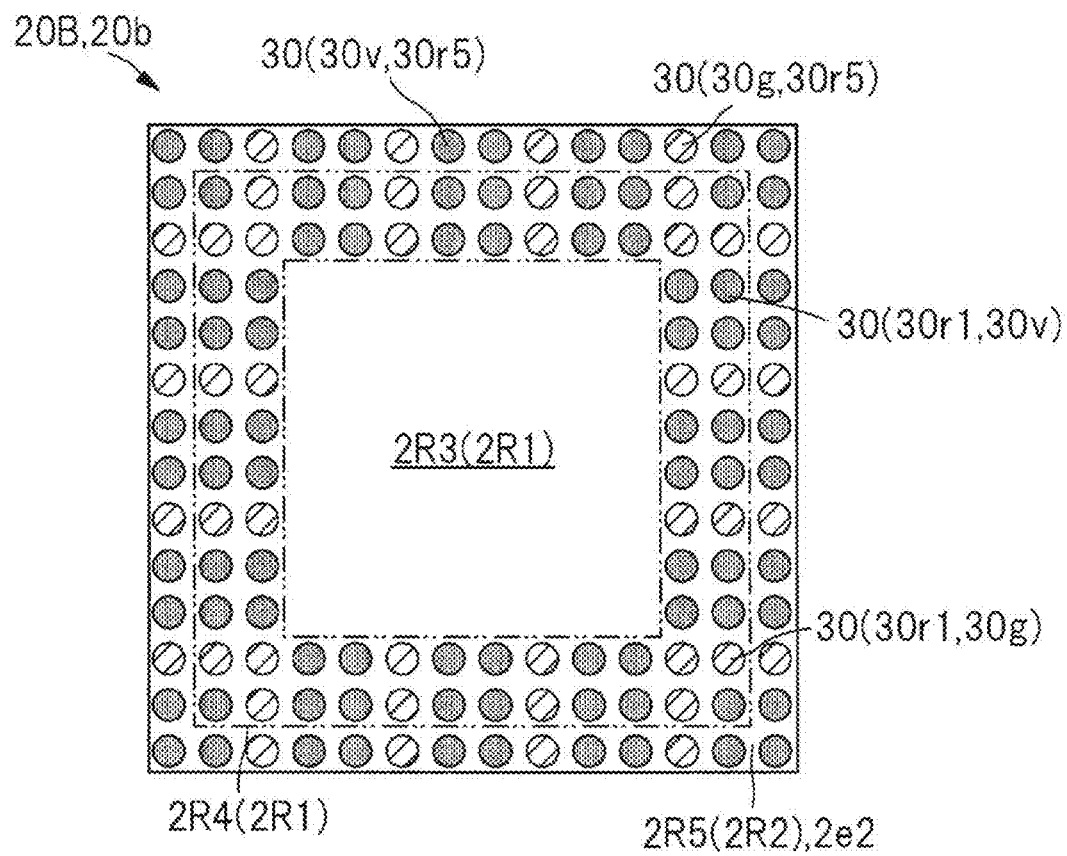
FIG. 18 is an enlarged plan view showing another modification of the wiring substrate shown in FIG. 16.
Figure 19:
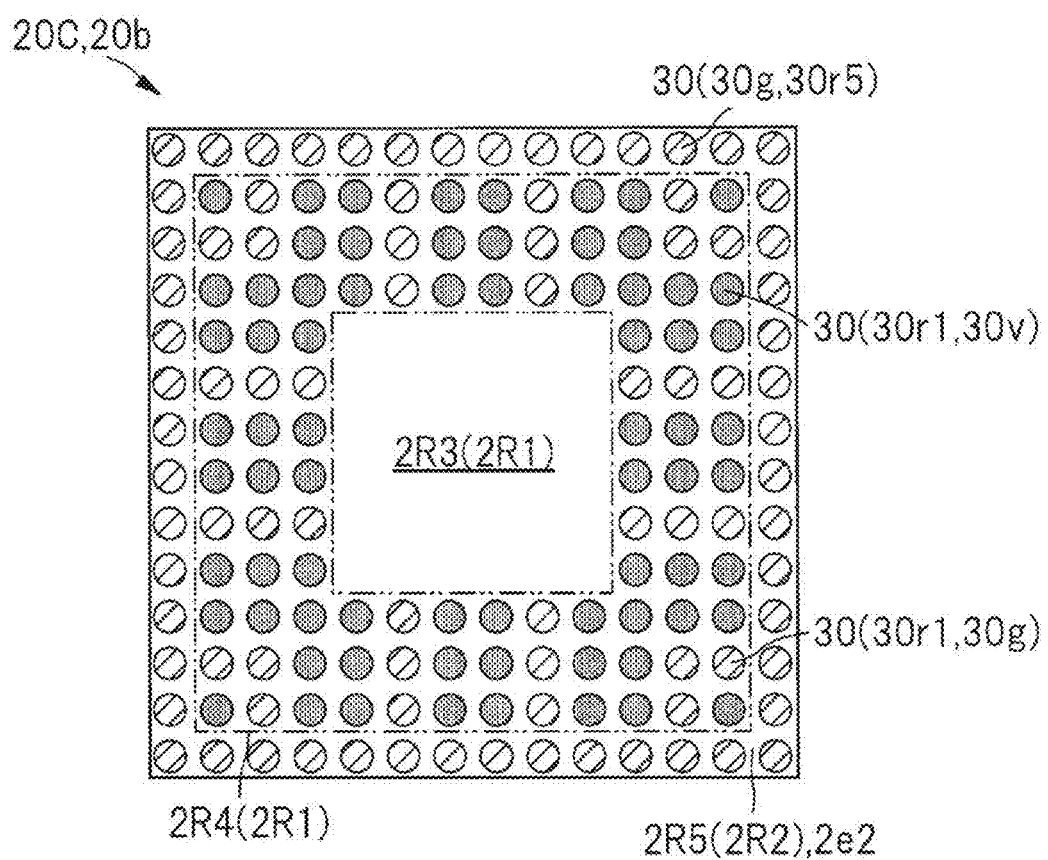
FIG. 19 an enlarged plan view showing another modification of the wiring substrate shown in FIG. 16.

In the wiring substrate 20B shown in FIG. 18, up to 144 external terminals 30 (12 columns×12 rows) can be arranged in the region 2R1. On the other hand, the number of external terminals 30 arranged on the area 2R4 of the wiring substrate 20B is 80.

Therefore, the area of the region 2R3 is 44.4% of the area of the region 2R1. In the wiring substrate 20B, the external terminals 30 are arranged in two rows in the region 2R4, and the number of the power supply terminals 30v arranged in the region 2R4 is 50. In this case, the power supply potential VD shown in FIG. 5 can be stably supplied as compared with the wiring substrate 20A shown in FIG. 17. In the wiring substrate 20B, 36 power supply terminals 30v are arranged in the area 2R5.

In addition to the wiring substrate 20A shown in FIG. 17 and the wiring substrate 20B shown in FIG. 18, the inventors of the present application examined the maximum arrangement number of the external terminals 30 in the area 2R1 from 36 to 169, respectively. As a result, when the area of the region 2R3 is 56% or less with respect to the area of the region 2R1, the number of the power supply terminals 30v arranged in the region 2R4 and the region 2R5 is half or more with respect to the largest arrangement quantity of the external terminals 30 in the region 2R1. Therefore, it is preferable that the area of the region 2R3 is 56% or less with respect to the area of the region 2R1.

However, in order to increase the number of supply paths of the power supply potential VD in the region 2R1, it is preferable that the external terminals 30 are arranged in a plurality of rows at least in the region 2R4. The wiring substrate 20B shown in FIG. 18 is exemplified when the region ratio of the area 2R3 is the largest when the term that the external terminals 30 are arranged in a plurality of rows in the area 2R4 is added. Therefore, in order to increase the number of the power supply terminals 30v arranged in the region 2R1, it is particularly preferable that the area of the region 2R3 is 44% or less of the area of the region 2R1.

In the wiring substrate 20C shown in FIG. 19, up to 144 external terminals 30 (12 columns×12 rows) can be arranged in the region 2R1. This point is the same as that of the wiring substrate 20B shown in FIG. 18. However, in the wiring substrate 20C, the plurality of terminals 30r5 arranged in the area 2R5 includes the plurality of reference terminals 30g and do not includes the plurality of power supply terminals 30v. In other words, the power supply terminal 30v is not arranged in the region 2R5 of the wiring substrate 20C. The number of external terminals 30 arranged in the area 2R4 of the wiring substrate 20C is 108. Therefore, the area of the region 2R3 is 25.0% of the area of the region 2R1. In the wiring substrate 20C, the external terminals 30 are arranged in three rows in the region 2R4, and the number of the power supply terminals 30v arranged in the region 2R4 is 72. Therefore, in the wiring substrate 20B, although the power supply terminals 30v are not arranged in the region 2R5, the number of the power supply terminals 30v arranged in the region 2R4 is half or more of the largest arrangement quantity of the external terminals 30 in the region 2R1.

<Electronics device> In addition to the wiring substrate 20C shown in FIG. 19, the inventors of the present application have examined the maximum number of external terminals 30 in the area 2R1 from 36 to 169. As a result, it has been found that when the area of the region 2R3 is 25% or less of the area of the region 2R1, the number of power supply terminals 30v arranged in the region 2R4 is half or more of the largest arrangement quantity of the external terminals 30 in the region 2R1. Therefore, if the power supply terminal 30v is not disposed in the area 2R5, the area of the area 2R3 is preferably not more than 25% of the area of the area 2R1.

Figure 20:
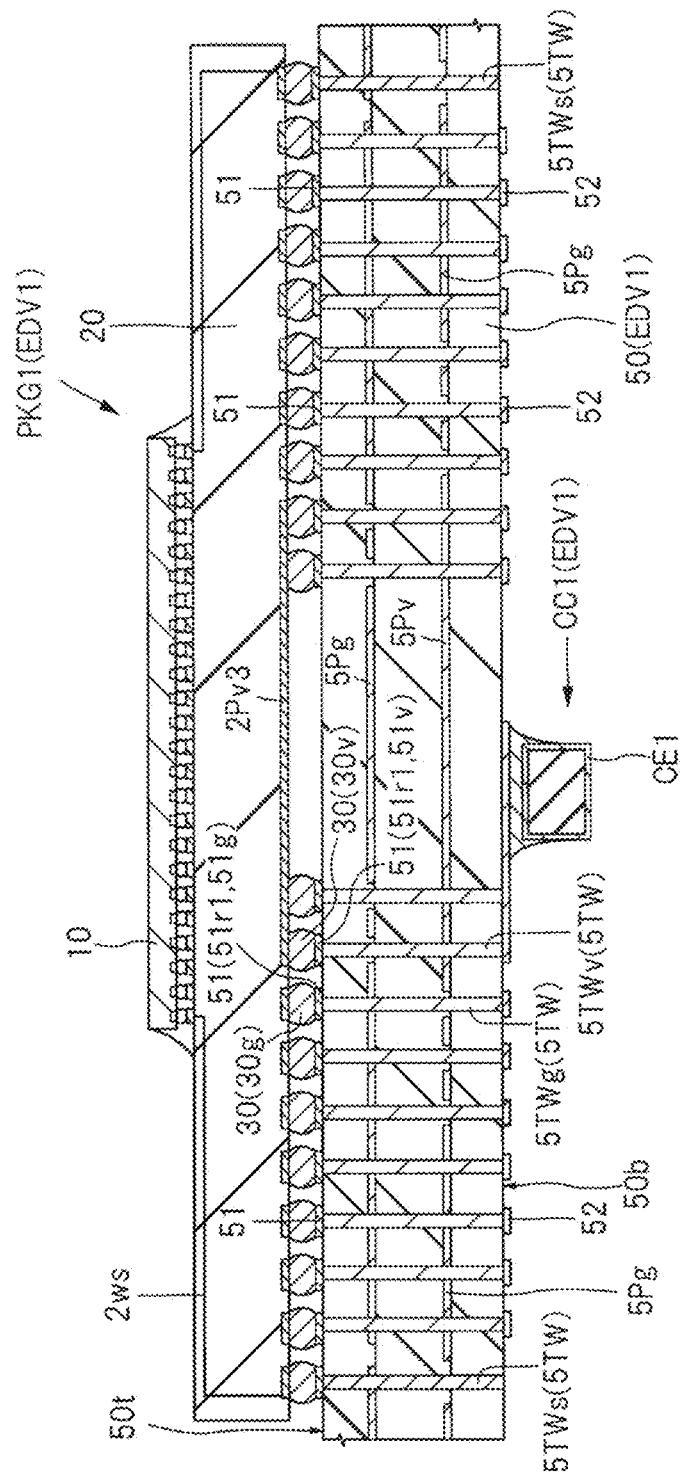
FIG. 20 is a cross-sectional view of an electronic device in which the semiconductor device shown in FIG. 4 is mounted on a mounting substrate.
Figure 21:
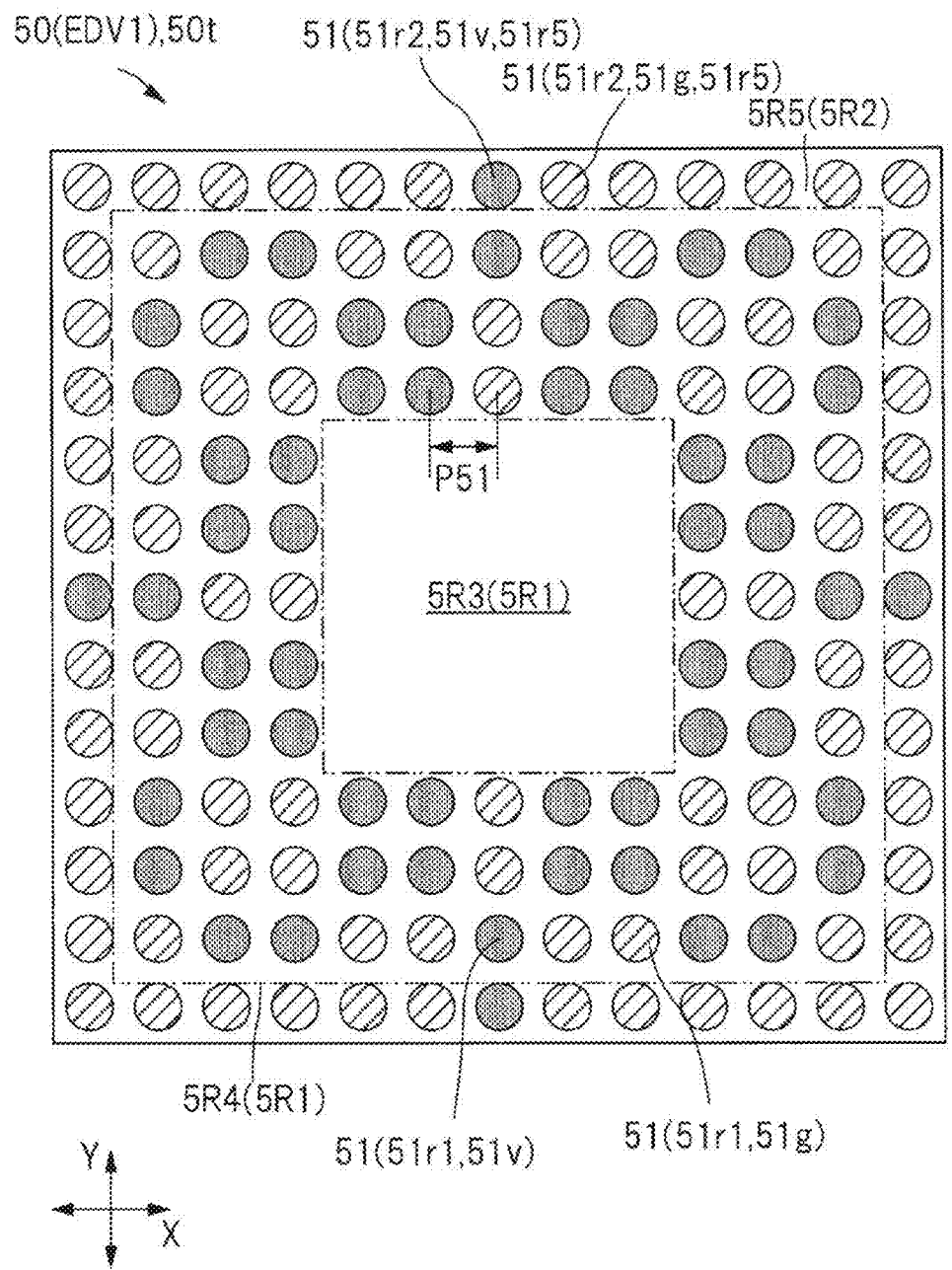
FIG. 21 is an enlarged plan view of the top surface of the mounting substrate shown in FIG. 20.
Figure 22:
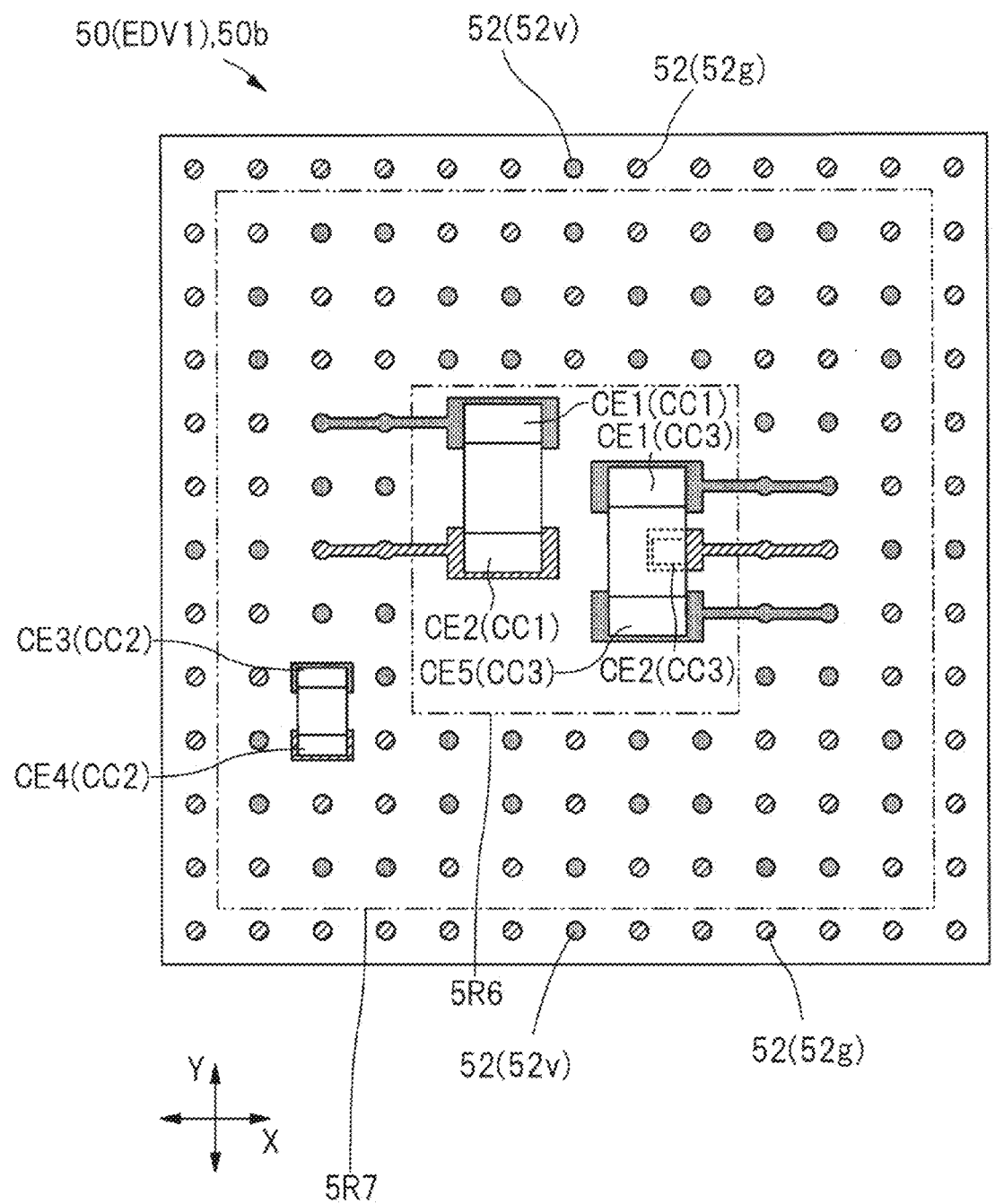
FIG. 22 is an enlarged plan view of the lower surface of the mounting substrate shown in FIG. 20.
Figure 23:
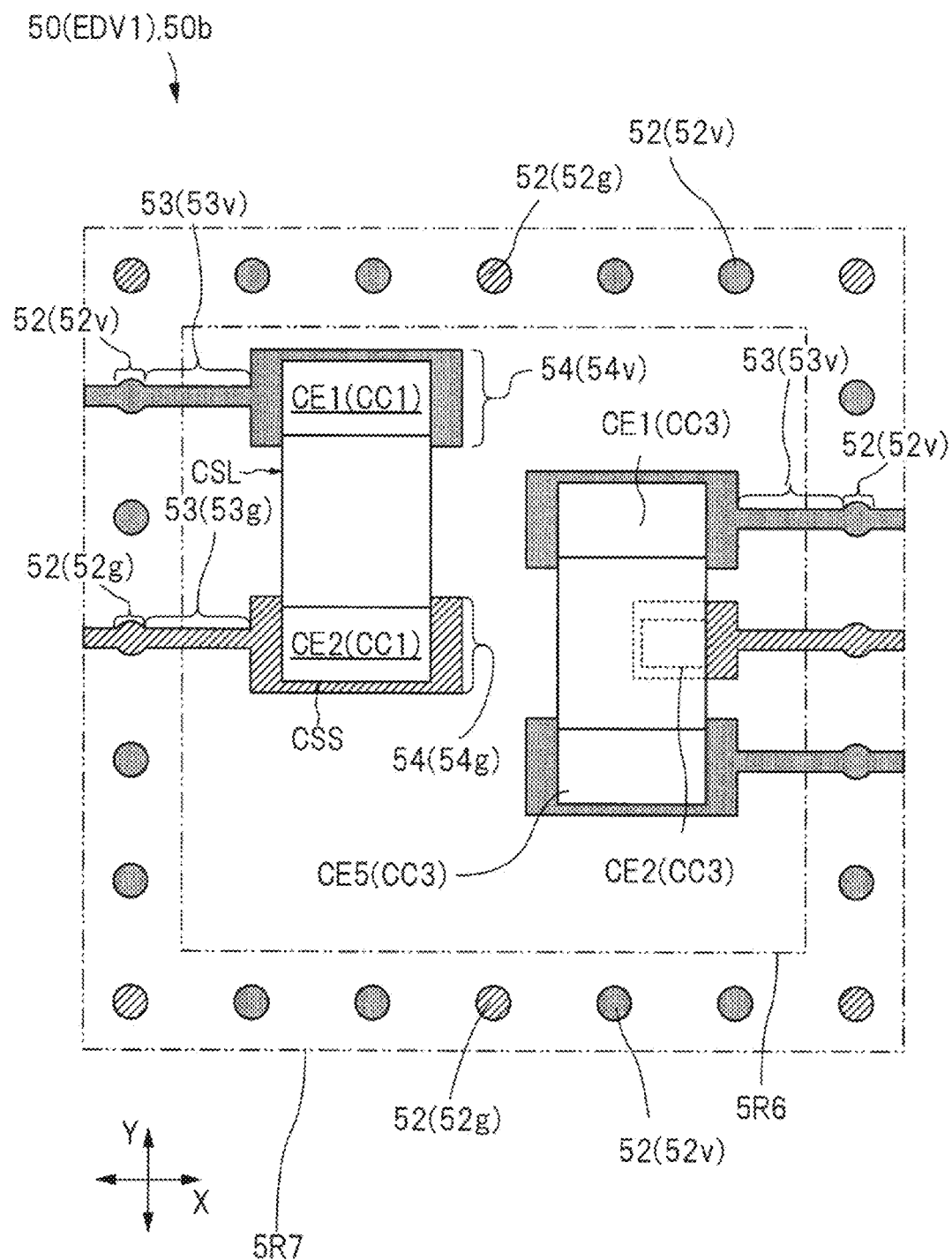
FIG. 23 is an enlarged plan view of the periphery of the region where the capacitor of FIG. 22 is mounted.

Next, a configuration example of an electronic device obtained by mounting the semiconductor device described with reference to FIGS. 1 to 19 on a mounting substrate will be described. FIG. 20 is a cross-sectional view of an electronic device in which the semiconductor device shown in FIG. 4 is mounted on a mounting substrate. FIG. 21 is an enlarged plan view of the top surface of the mounting substrate shown in FIG. 20. FIG. 21 shows regions 2R1 and 2R5 of the wiring substrate 20 shown in FIG. 16. FIG. 22 is an enlarged plan view of the lower surface of the mounting substrate shown in FIG. 20. FIG. 23 is an enlarged plan view of the periphery of the region where the capacitor of FIG. 22 is mounted.

The electronic device EDV1 shown in FIG. 20 includes the semiconductor device (semiconductor package) PKG1 described with reference to FIGS. 1 to 19, and a mounting substrate (wiring substrate) 50 on which the semiconductor device PKG1 is mounted.

The mounting substrate 50 has an upper surface 50t on which the semiconductor device PKG1 is mounted, a plurality of upper surface terminals (terminals) 51 formed on the upper surface 50t and electrically connected to the plurality of external terminals 30 of the wiring substrate 20, and a lower surface 50b on the other side of the upper surface 50t.

Each of the plurality of upper surface terminals 51 disposed on the upper surface 50t of the mounting board 50 is disposed so as to face the plurality of external terminals 30 of the semiconductor device PKG1, and is electrically connected to the plurality of external terminals 30.

As shown in FIG. 21, the top surface 50t of the mounting substrate 50 includes a region 5R1 overlapping the semiconductor chip 10 (see FIG. 15) and a region 5R2 surrounding the region 5R1 and not overlapping the semiconductor chip 10. The region 5R1 includes a region 5R3 in which the plurality of external terminals 30 is not arranged, and a region 5R4 surrounding the region 5R3 in which the plurality of external terminals 30 is arranged. An upper surface terminal 51 is disposed in the region 5R4. The plurality of upper surface terminals 51 includes a plurality of terminals 51r1 arranged in the region 5R4 of the region 5R1 and a plurality of terminals 51r2 arranged in the region 5R2. The plurality of terminals 51r1 includes a plurality of power supply terminals 51v for supplying a power supply potential VD (see FIG. 5) to the core circuit 12 (see FIG. 5) of the semiconductor chip 10 (see FIG. 5), and a plurality of reference terminals 51g for supplying a reference potential VG (see FIG. 5) to the core circuit 12 of the semiconductor chip 10.

As shown in FIG. 20, the mounting substrate 50 has a plurality of through-hole wirings 5TW provided so as to penetrate from one to the other of the upper surface 50t and the lower surface 50b. The plurality of through-hole wiring 5TW includes a through-hole wiring 5TWv electrically connected to the power supply terminal 30v of the wiring substrate 20 and a through-hole wiring 5TWg electrically connected to the reference terminal 30g of the wiring substrate 20. The plurality of through-hole wirings 5TW includes through-hole wirings 5TWs for transmitting electric signals SIG (see FIG. 5). Each of the plurality of through-hole wirings 5TW electrically connects the plurality of upper surface terminals 51 on the upper surface 50t of the mounting substrate 50 and the plurality of lower surface terminals 52 on the lower surface 50b. Among the upper surface terminal 51 and the lower surface terminal 52, the upper surface terminal 51 is a terminal connected to the external terminal 30 of the semiconductor device PKG1. On the other hand, each of the plurality of lower surface terminals 52 is a through-hole land disposed at an end portion of the through-hole wiring 5TW. Therefore, the lower surface terminal 52 is not connected to components other than the through-hole wiring 5TW, and may not function as an external terminal. As a modification of the lower surface terminal 52 shown in FIG. 22, an opening portion may be formed in the center of the lower surface terminal 52 in plan view. The through-hole wiring 5TW is a cylindrical metal member, and the opening portion of the lower surface terminal 52 communicates with the hole of the cylindrical through-hole wiring 5TW.

As shown in FIG. 22, a plurality of lower surface terminals 52 is arranged on the lower surface 50b of the mounting substrate 50. The lower surface 50b of the mounting substrate 50 has a region 5R6 overlapping with the region 2R3 of the wiring substrate 20 shown in FIG. 16 and a region 5R7 overlapping with the region 2R4 of the wiring substrate 20. The lower surface terminals 52 are not arranged in the region 5R6, and the plurality of lower surface terminals 52 is arranged in the region 5R7.

A capacitor CC1 having an electrode CE1 and an electrode CE2 is mounted on the region 5R6. The electrode CE1 is electrically connected to the power supply terminal 30v (see FIG. 21) of the wiring substrate 20 (see FIG. 21) via the through-hole wiring 5TWv (see FIG. 21), and the electrode CE2 is electrically connected to the reference terminal 30g (see FIG. 21) of the wiring substrate 20 via the through-hole wiring 5TWg (see FIG. 21).

The capacitor CC1 is a chip capacitor having a rectangular planar configuration. The capacitor CC1 has two long sides opposed to each other and two short sides crossing each of the two long sides. In the embodiment shown in FIG. 22, there is an electrode CE1 on one of the two short sides and an electrode CE2 on the other. When one electrode CE1 of the capacitor CC1 is connected to the power supply terminal 30v shown in FIG. 16 and the other electrode CE2 is connected to the reference terminal 30g shown in FIG. 16, the capacitor CC1 functions as a bypassing capacitor or a decoupling capacitor. There are various modifications to the planar size of the capacitor CC1, but depending on the degree of capacitance required for the capacitor CC1, a small capacitor may not be selected.

For example, in the example shown in FIG. 22, the lower surface 50b of the mounting substrate 50 has a region 5R7 overlapping with the region 2R4 (see FIG. 16) of the wiring substrate 20 (see FIG. 16), and a capacitor CC2 having an electrode CE3 and an electrode CE4 is mounted on the region 5R7.

In a plan view from the lower surface 50b of the mounting board 50, the area of the capacitor CC1 is greater than the area of the capacitor CC2. Thus, a small capacitor CC2 can be mounted on the region 5R6, but a small capacitor CC2 has a limited capacitance.

As shown in FIG. 23, in the capacitor CC1, the capacitor CC1 has a short side CSS and a long side CSL in plan view from the lower surface 50b of the mounting board 50. The length of the short side CSS is longer than the center-to-center distance P 51 of the upper surface terminals 51 disposed adjacent to each other among the plurality of upper surface terminals 51 disposed on the upper surface 50t shown in FIG. 21. When the large capacitor CC1 is arranged in the region 5R7 as in the capacitor CC2 shown in FIG. 22, the lower surface terminal 52 having the same potential is required to overlap with the electrode CE1 or the electrode CE2 of the capacitor CC1. Therefore, restrictions on the terminal layout are large.

In the present embodiment, since the capacitor CC1 is arranged in the region 5R6, the size of the capacitor CC1, in other words, the capacitance characteristics of the capacitor CC1 are not limited. Therefore, the driving voltage can be stably supplied to the core circuit 12 shown in FIG. 5. In the embodiment shown in FIG. 23, the capacitor terminal 54 on which the capacitor CC1 is mounted is arranged in the region 5R6, and the terminal 54 and the bottom terminal 52 are electrically connected to each other via the wire 53. The terminal 54v to which the power supply potential VD (see FIG. 5) is supplied and the power supply terminal 52v are electrically connected through the wiring 53v. The terminal 54g to which the reference potential VG is supplied and the reference terminal 52g are electrically connected via a wiring 53g. As described above, by interposing the wiring 53 between the capacitor terminal 54 and the lower surface terminal 52 disposed immediately below the through-hole wiring 5TW (see FIG. 20), the pitches of the lower surface terminals 52 can be freely set without being limited by the sizes of the capacitors CC1. Therefore, the degree of freedom in designing the layout of the plurality of upper surface terminals 51 shown in FIG. 21 can also be improved.

In the embodiment shown in FIG. 22, a capacitor CC3 having an electrode CE1, an electrode CE2, and an electrode CE5 is mounted on the region 5R6. The electrode CE1 and the electrode CE5 of the capacitor CC3 are electrically connected to the power supply terminal 30v of the wiring substrate 20 via the through-hole wiring 5TWv shown in FIG. 20. The electrodes CE2 of the capacitors CC3 are electrically connected to the reference terminals 30g of the wiring substrate 20 via the through-hole wiring 5TWg shown in FIG. 20. The capacitor CC3 is a so-called three-terminal capacitor comprising three electrodes. Since the three-terminal capacitor has a very low impedance in the high-frequency region, it is possible to configure a power supply circuit having high noise resistance as compared with the two-terminal capacitor.

However, since the capacitor CC3, which is a three-terminal capacitor, has the electrodes CE1, the CE2, and the CE5, if the capacitor CC3 is arranged in the region 5R7, the restrictions on the layouts of the lower surface terminals 52 are very large. A terminal 54 for a capacitor on which the capacitor CC3 shown in FIG. 23 is mounted is arranged in the region 5R6, and the terminal 54 and the bottom terminal 52 are electrically connected to each other via a wire 53. As in the present embodiment, when there is a region 5R6 in which the bottom terminal 52 is not arranged, the capacitor CC3 is arranged in the region 5R6, whereby the degree of freedom in designing the terminal layouts of the bottom terminal 52 can be improved.

In the example shown in FIG. 20, the mounting substrate 50 includes a plurality of wiring layers (two layers in FIG. 20) between the upper surface 50t and the lower surface 50b. In the wiring layer between the upper surface 50t and the lower surface 50b, a conductive pattern having a large area is arranged similarly to the wiring substrate 20. For example, the conductive pattern 5Pg to which the reference potential VG (see FIG. 5) is supplied is arranged in the wiring layer of the second layer of the mounting substrate 50 (the wiring layer one below the layer in which the plurality of upper surface terminals 51 is arranged). The conductive pattern 5Pg is provided on most of the second wiring layer. A plurality of opening portions is provided in the conductive patterns 5Pg, and through-hole wirings 5TWv and the like are arranged in the opening portions.

The conductive pattern 5Pv to which the power supply potential VD (see FIG. 5) is supplied is arranged in the third wiring layer (one wiring layer below the second wiring layer) of the mounting substrate 50. The conductive pattern 5Pv is arranged in a region overlapping with the semiconductor chip 10. In this manner, the paths to which the same potential is supplied are electrically connected to each other via the large-area conductive pattern, whereby the power supply potential and the reference potential can be stably supplied.

Although some modifications have been described in the above embodiment, typical modifications other than the modifications described in the above embodiment will be described below.

Figure 24:
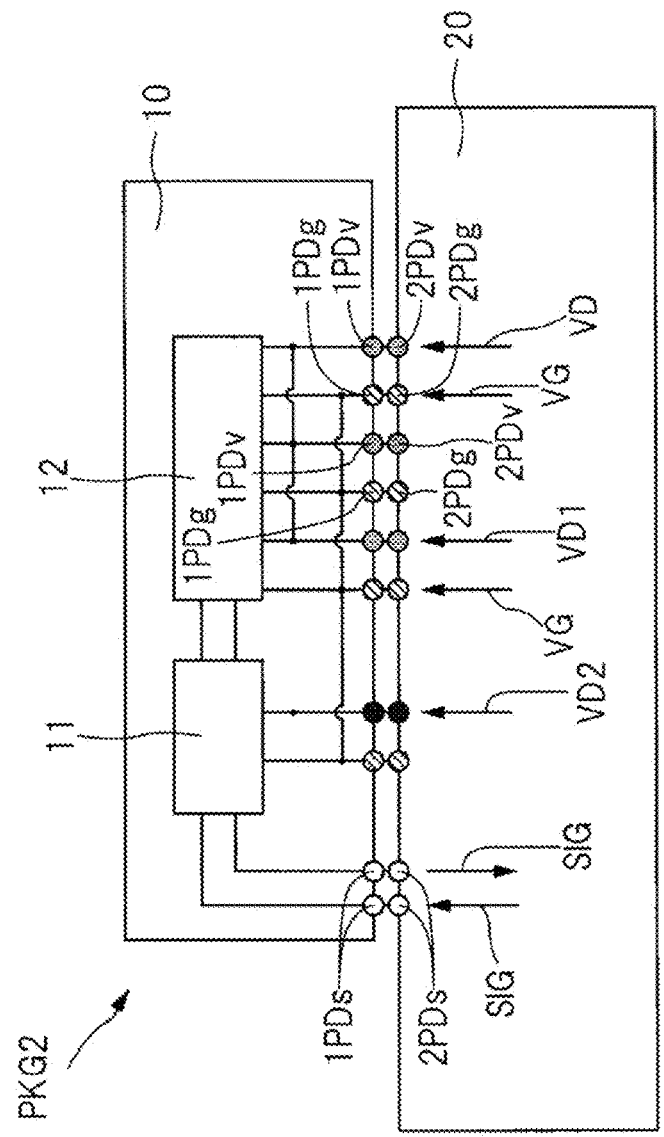
FIG. 24 is an explanatory diagram schematically showing an example of a circuit configuration of a semiconductor device which is a modification to FIG. 5.
Figure 25:
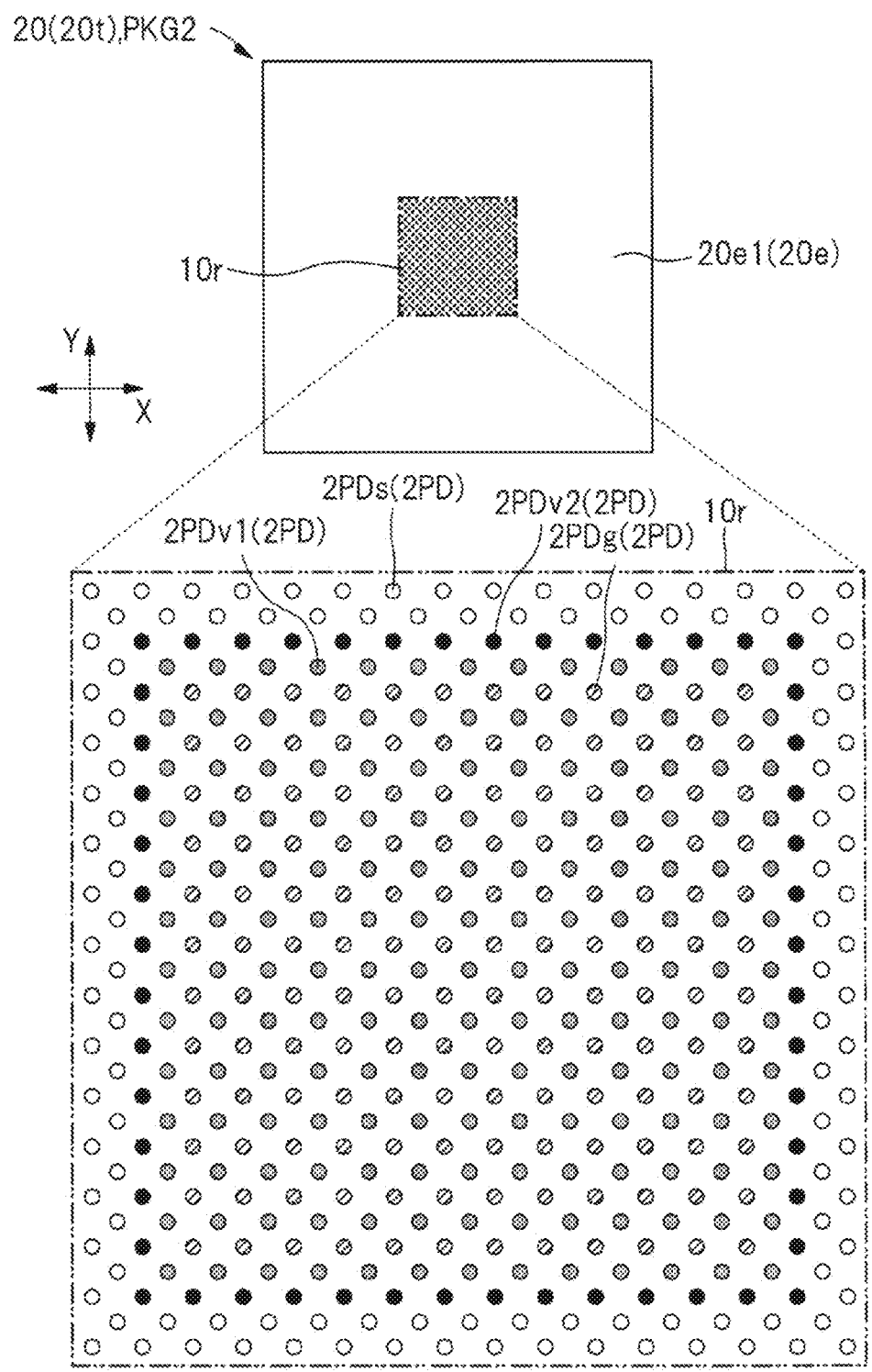
FIG. 25 is a plan view showing a configuration example of the terminal layout on the upper surface of the wiring substrate of the semiconductor device shown in FIG. 24.

<Modification 1> FIG. 24 is an explanatory diagram schematically showing a circuit configuration example of a semiconductor device which is a modification to FIG. 5. FIG. 25 is a plan view showing a configuration example of the terminal layout on the upper surface of the wiring substrate of the semiconductor device shown in FIG. 24. In FIG. 25, dotted patterns and hatching are applied to a plurality of terminals 2PD in accordance with the same rules as in FIG. 7. In FIG. 25, dot patterns darker than the dot patterns of the plurality of terminals 2PDv1 is attached to each of the plurality of terminals 2PDv2. In the case of the semiconductor device PKG1 shown in FIG. 5, the case where the power supply potential VD supplied to the semiconductor chips 10 is one type has been described. A plurality of types of power supply potentials may be supplied to the semiconductor chip 10. For example, in the semiconductor device PKG2 shown in FIG. 24, a power supply potential VD2 that differs from the power supply potential VD1 supplied to the core circuit 12 is supplied to the input/output circuit 11 of the semiconductor chip 10.

As described above, the input/output circuit 11 is a circuit for inputting or outputting an electric signal SIG to or from the outside of the semiconductor chip 10. For this reason, the terminals for supplying the power supply potential VD2 to the input/output circuits 11 are arranged in the vicinity of the terminals for transmitting the electric signals SIG. For example, in the example shown in FIG. 25, on the upper surface 20t of the wiring substrate 20, a plurality of signal-transmitting terminals 2PDs is arranged at the periphery of the chip mounting region 10r, and a plurality of terminals 2PDv1 for supplying the power supply potential VD1 (see FIG. 24) to the core circuit 12 (see FIG. 24) and a terminal 2PDg for supplying the reference potential VG (see FIG. 24) are arranged at the center of the chip mounting region 10r. Between a central portion where a plurality of terminals 2PDv1 and 2PDg are arranged and a peripheral portion where a plurality of terminals 2PDs is arranged, there is an region where a plurality of terminals 2PDv2 are arranged.

Compared with the core circuit 12, the input/output circuit 11 shown in FIG. 24 is less susceptible to malfunction due to voltage fluctuations. Therefore, even if the path length of the path for supplying the power supply potential VD2 is longer or the path cross-sectional area is smaller than that of the path for supplying the power supply potential VD1, the effect on the operation characteristics of the semiconductor chip 10 is relatively small. As shown in FIG. 25, when a plurality of terminals 2PDv2 is arranged along the periphery of the chip mounting region 10r, a path connected to a plurality of terminals 2PDv1 for supplying the power supply potential VD1 (see FIG. 24) to the core circuit 12 (see FIG. 24) can be arranged at the center of a region overlapping with the semiconductor chip 10 (see FIG. 4). The path for supplying the power supply potential VD2 can be pulled out from a region overlapping with the semiconductor chip 10 to a region not overlapping with the semiconductor chip 10 in the wiring layer WL4 shown in FIG. 4, for example. In this case, at the lower surface 20b of the wiring substrate 20 illustrated in FIG. 16, the layout of the region 2R1 periphery overlapping the semiconductor chip 10 (see FIG. 4) can be similar to the layout of the semiconductor device PKG1 illustrated in FIG. 16.

Figure 26:
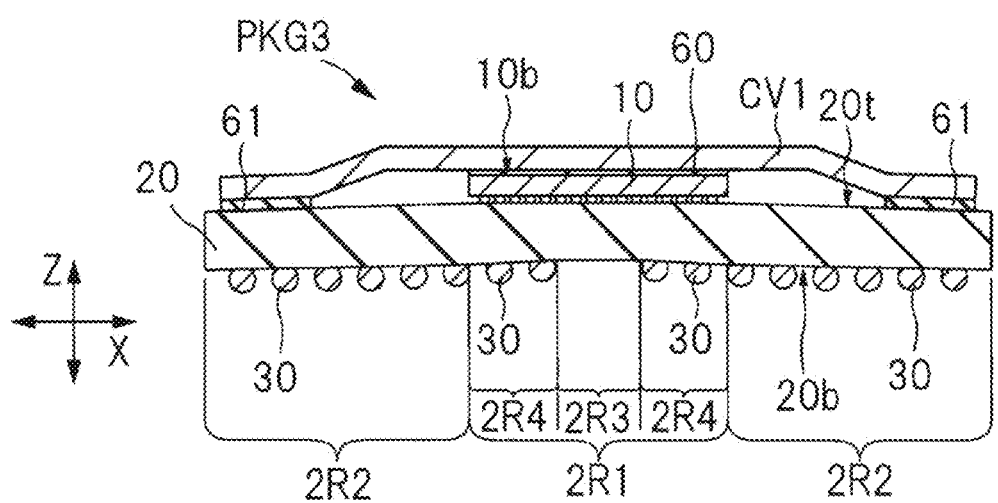
FIG. 26 is a cross-sectional view showing a modification to FIG. 15.

<Modification 2> FIG. 26 is a cross-sectional view showing a modification to FIG. 15. The semiconductor device PKG3 shown in FIG. 26 differs from the semiconductor device PKG1 shown in FIG. 15 in that a cover member (lid) CV1 is disposed on the wiring substrate 20.

The cover member CV1 is, for example, a metallic member, and is adhered and fixed to the peripheral portion of the upper surface 20t of the wiring substrate 20 and the back surface 10b of the semiconductor chip 10. Between the back surface 10b of the semiconductor chip 10 and the covering member CV1, an adhesive (heat-dissipating adhesive) 60 including a large number of heat-dissipating particles exhibiting a high heat dissipation property, such as metallic particles, is disposed. By bonding the semiconductor chips 10 and the metallic covering member CV1 via the highly heat-dissipating adhesive 60, the heat-dissipating characteristics of the semiconductor device PKG3 can be improved.

The peripheral portion of the covering member CV1 is bonded to the upper surface 20t of the wiring substrate 20 via an adhesive 61. The adhesive 61 overlaps with the external terminal 30 disposed on the outermost circumference of the plurality of external terminals 30. In this manner, by bonding the hard covering member CV1 and the wiring substrate 20 to each other at the peripheral portion of the wiring substrate 20, the degree of warp deformation of the wiring substrate 20 can be suppressed. Since coplanarity of the plurality of external terminals 30 can be reduced, the external terminals 30 can be disposed in the region 2R1 overlapping with the semiconductor chip 10.

However, even when a member capable of correcting the warp deformation of the wiring substrate 20 is attached as in the case of the covering member CV1, it is difficult to correct the warp deformation of the region overlapping the semiconductor chip 10. Therefore, even when the covering member CV1 is arranged, the external terminals 30 are not arranged in the region 2R3 as shown in FIG. 16.

Note that the adhesive 61 shown in FIG. 26 may be the same material as the adhesive 60, or may be an adhesive that does not contain heat dissipating particles. The adhesive 61 disposed in the peripheral region of the wiring substrate 20 is required to enhance the bonding strength more than the heat dissipation characteristics.

Figure 27:
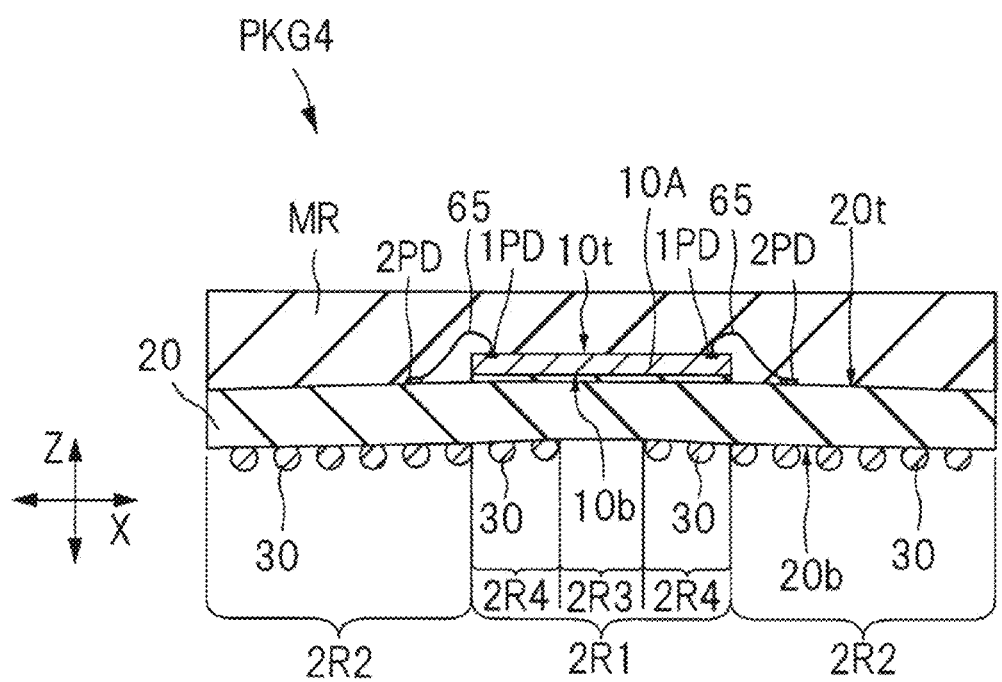
FIG. 27 is a cross-sectional view showing another modification to the semiconductor device shown in FIG. 15.
Figure 28:
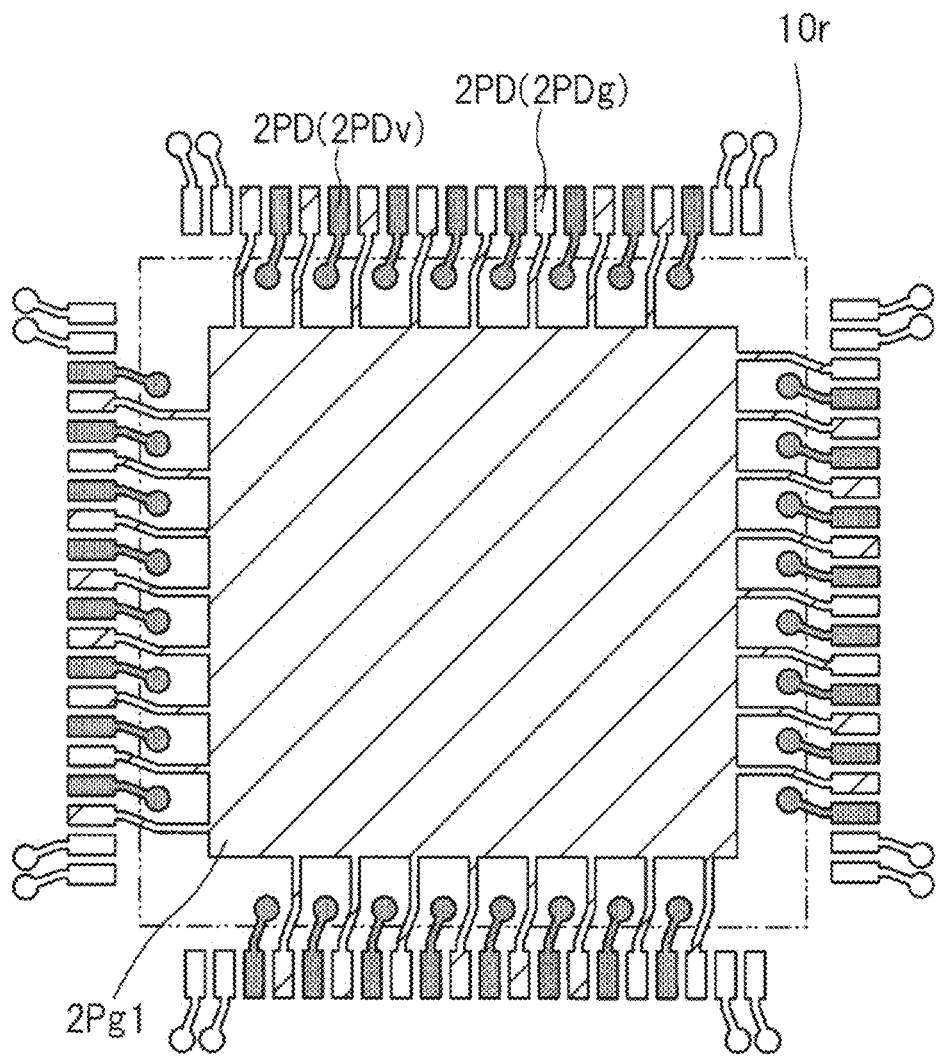
FIG. 28 is a plan view showing an example of the layout of the first wiring layer in the wiring substrate shown in FIG. 27.
Figure 29:
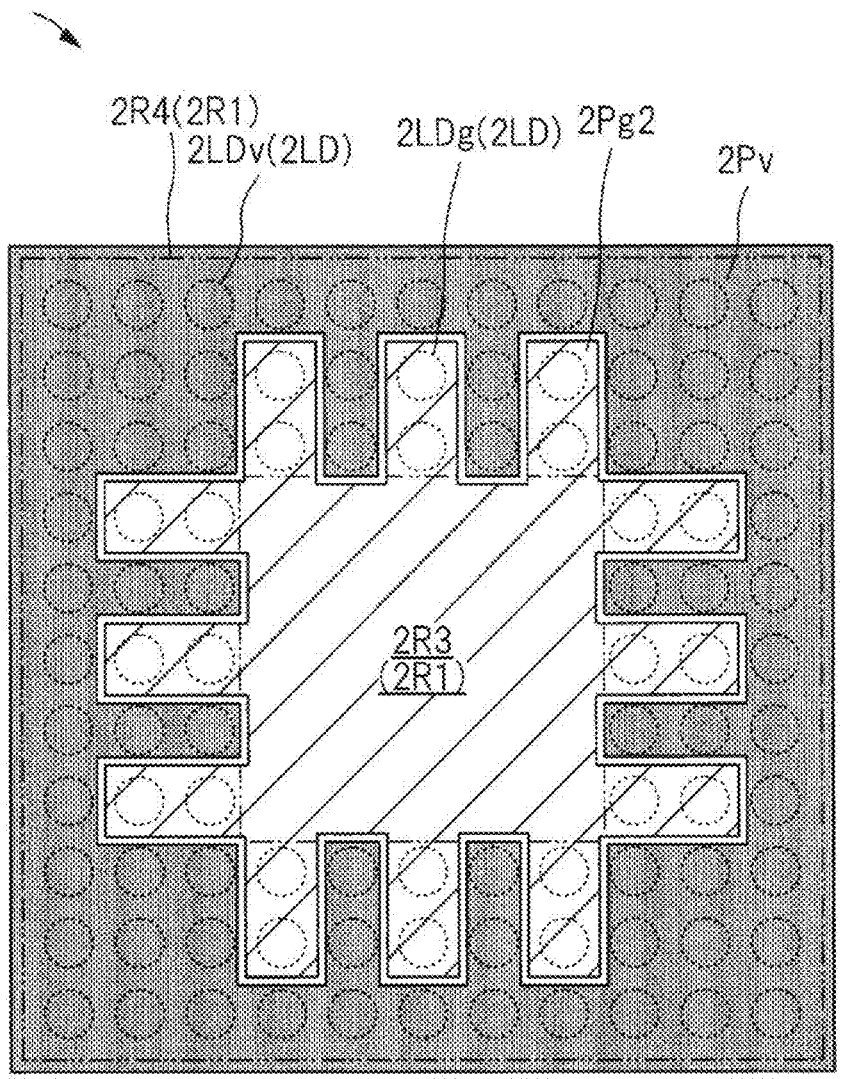
FIG. 29 is a plan view showing an example of the layout of the lowermost wiring layer in the wiring substrate shown in FIG. 27.
Figure 29:
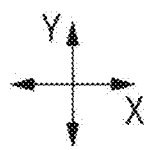

<Modification 3> FIG. 27 is a cross-sectional view showing another modification to the semiconductor device shown in FIG. 15. FIG. 28 is a plan view showing an example of the layout of the first wiring layer in the wiring substrate shown in FIG. 27. FIG. 29 is a plan view showing an example of the layout of the lowermost wiring layer in the wiring substrate shown in FIG. 27. The wiring substrate of the semiconductor device PKG4 has a two-layer structure including the wiring layer WL1 of the first layer shown in FIG. 28 and the wiring layer WL2 of the second layer shown in FIG. 29. In FIG. 27, an insulating film covering the first wiring layer and the second wiring layer of the wiring substrate 20 is omitted.

The semiconductor device PKG4 shown in FIG. 27 differs from the semiconductor device PKG1 shown in FIG. 15 in that the rear surface 10b of the semiconductor chip 10A is mounted on the wiring substrate 20 by a face-up mounting method in which the rear surface 10b of the semiconductor chip 10A faces the upper surface 20t of the wiring substrate 20. The semiconductor chip 10A has a plurality of electrodes 1PD arranged in the peripheral area of the front surface 10t of the semiconductor chip 10A. Further, the plurality of terminals 2PD arranged on the upper surface 20t of the wiring substrate 20 is not arranged in an area overlapping with the semiconductor chip 10A, but are arranged around the semiconductor chip 10A. The plurality of electrodes 1PD and the plurality of terminals 2PD are electrically connected via wires 65.

Each of the semiconductor chip 10A, the plurality of terminals 2PD, and the plurality of wires 65 is sealed by a sealing member MR. The entire upper surface 20t of the wiring substrate 20 is covered with the sealing body MR.

When the semiconductor chip 10A and the wiring substrate 20 are connected by the wire 65 as in the semiconductor device PKG4, the bonding strength between the semiconductor chip 10A and the wiring substrate 20 is not strong as compared with the semiconductor device PKG1 shown in FIG. 15. Therefore, the degree of the warp deformation of the wiring substrate 20 caused by the difference in the linear expansion coefficients between the semiconductor chips 10A and the wiring substrate 20 is smaller than that of the semiconductor device PKG1. However, the sealing body MR is bonded to the upper surface 20t of the wiring substrate 20. Due to the difference in the coefficient of linear expansion between the sealing body MR and the wiring substrate 20, warpage deformation occurs in the wiring substrate 20.

Therefore, also in the semiconductor device PKG4, it is preferable to provide a region 2R3 in which the external terminals 30 are not arranged in a part of the region 2R1 overlapping with the semiconductor chips 10A in view of coplanarity.

As shown in FIG. 28, in the semiconductor device PKG4, the plurality of terminals 2PD of the wiring substrate 20 is arranged on the outer side of the chip mounting area 10r in which the semiconductor chip 10A (see FIG. 27) is mounted. Therefore, considering the path distance to the core circuit 12 (see FIG. 5), a modification in which the land 2LDv is disposed in the region 2R1 illustrated in FIG. 29 is considered. However, when a conductive pattern having a large area is interposed in a path for supplying the power supply potential, for example, the conductive pattern 2Pv shown in FIG. 29, it is preferable to arrange a plurality of lands 2LDv in an area 2R1 overlapping with the semiconductor chip 10A (see FIG. 27). In this instance, similarly to the semiconductor device PKG1 described with reference to FIG. 16, the region 2R1 includes a region 2R3 in which the external terminals 30 are not arranged and a region 2R4 in which the plurality of external terminals 30 is arranged. As shown in FIG. 29, in the wiring layers WL2, large-area conductive patterns 2Pv to which the power supply potential VD (see FIG. 5) is supplied are arranged in the regions 2R4. In addition, the conductive pattern 2Pg2 to which the reference potential VG (see FIG. 5) is supplied is disposed on the region 2R3. The area of the conductive pattern 2Pg2 is smaller than the area of the conductive pattern 2Pv. However, as shown in FIG. 28, in the wiring layers WL1, large-area conductive patterns 2Pg1 to which the reference potential VG is supplied are arranged inside the chip-mounting area 10r. The conductive pattern 2Pg2 is disposed inside the conductive pattern 2Pv. For a semiconductor device PKG4, each of the power supply potential VD and the reference potential VG can be stably supplied, thereby improving the reliability of the core circuit 12 (see FIG. 5) as well as the semiconductor device PKG1.

<Modification 4> and, for example, various modifications as described above have been described, but the various modifications described above can be applied in combination with each other.

Although the invention made by the present inventor has been specifically described based on the embodiment, the present invention is not limited to the above embodiment, and it is needless to say that various modifications can be made without departing from the gist thereof.

What is claimed is:
1. A semiconductor device, comprising:
   a wiring substrate having an upper surface, a plurality of first terminals formed on the upper surface, a lower surface opposite the upper surface, and a plurality of second terminals formed on the lower surface and electrically connected to each of the plurality of first terminals; and
   a semiconductor chip having a front surface, a plurality of electrode pads formed on the front surface, and a back surface on opposite the front surface and mounted on the upper surface of the wiring substrate, wherein the lower surface of the wiring substrate includes a first region overlapping with the semiconductor chip mounted on the upper surface, and a second region surrounding the first region and not overlapping the semiconductor chip, wherein the first region includes a third region in which the plurality of second terminals is not disposed, a fourth region surrounding the third region, and in which the plurality of second terminals is disposed, wherein the plurality of second terminals includes a plurality of first region terminals disposed in the fourth region of the first region, and a plurality of second region terminals disposed in the second region, wherein the plurality of first region terminals includes a plurality of first power supply terminals for supplying a first power supply potential to a circuit of the semiconductor chip, and a plurality of reference terminals for supplying a reference potential to a circuit of the semiconductor chip, and wherein an area of the third region is 56% or less of an area of the first region.

2. The semiconductor device according to claim 1, wherein the number of the plurality of first power supply terminals arranged in the fourth region is greater than the number of the plurality of reference terminals arranged in the fourth region.

3. The semiconductor device according to claim 2, wherein a plurality of terminals disposed adjacent to each of the plurality of first power supply terminals include one or more reference terminals.

4. The semiconductor device according to claim 3, wherein a plurality of terminals arranged adjacent to each of the plurality of first power supply terminals include one or more first power supply terminals.

5. The semiconductor device according to claim 3, wherein the second region includes a fifth region surrounding a periphery of the fourth region, wherein in the fifth region, a plurality of fifth region terminals included in the plurality of second terminals are arranged in a row so as to surround a periphery of the fourth region, and the plurality of fifth region terminals include the plurality of first power supply terminals and the plurality of reference terminals.

6. The semiconductor device according to claim 1, wherein the maximum number of the plurality of first region terminals is equal to or greater than 36, and equal to or less than 169, and wherein the area of the third region is 25% or less of the area of the first region.

7. The semiconductor device according to claim 6, wherein the second region includes a fifth region surrounding a periphery of the fourth region, and wherein in the fifth region, a plurality of fifth region terminals included in the plurality of second terminals are arranged in a row so as to surround a periphery of the fourth region, and the plurality of fifth region terminals include the plurality of reference terminals and do not include the plurality of first power supply terminals.

8. A electronic device, comprising:
a semiconductor package having a first wiring substrate and a semiconductor chip mounted on the first wiring substrate; and
a second wiring substrate on which the semiconductor package is mounted, wherein the semiconductor package includes:
the first wiring substrate having a first upper surface, a first lower surface, a plurality of first terminals formed on the first upper surface, and a plurality of second terminals formed on the first lower surface and electrically connected with the plurality of the first terminals respectively; and
the semiconductor chip having a first front surface, a first rear surface opposite the first front surface, and a plurality of first electrode pads and mounted on the first wiring substrate, wherein the second wiring substrate have a second upper surface, a second lower surface, and a plurality of third terminals formed on the second upper surface and is electrically connected with the plurality of second terminals respectively, wherein the second upper surface of the second wiring substrate includes a first region overlapping the semiconductor chip mounted on the first wiring substrate, and a second region surrounding the first region and not overlapping the semiconductor chip, wherein the first region includes a third region in which the plurality of third terminals is not disposed, a fourth region surrounding the third region, and in which the plurality of third terminals is disposed, wherein the plurality of third terminals includes a plurality of first region terminals disposed in the fourth region of the first region, and a plurality of second region terminals disposed in the second region, and wherein the plurality of first region terminals includes a plurality of first power supply terminals for supplying a first power supply potential to a circuit of the semiconductor chip, and a plurality of reference terminals for supplying a reference potential to a circuit of the semiconductor chip.

9. The electronic device according to claim 8,
wherein the second wiring substrate has a plurality of through-hole wirings provided so as to pass through one of the second upper surface and the second lower surface to the other, wherein the plurality of through-hole wirings includes a first power supply through-hole wiring electrically connected to any of the plurality of first power supply terminals of the second wiring substrate, and a reference through-hole wiring electrically connected to any of the plurality of reference terminals of the second wiring substrate, wherein the second lower surface of the second wiring substrate has a sixth region overlapping the third region of the second wiring substrate, and a first capacitor having a first electrode and a second electrode is mounted on the sixth region, wherein the first electrode is electrically connected to any of the plurality of first power supply terminals of the second wiring substrate via the first power through-hole wiring, and wherein the second electrode is electrically connected to any of the plurality of reference terminals of the second wiring substrate via the reference through-hole wiring.

10. The electronic device according to claim 9,
wherein the first capacitor has a first short side and a first long side in plan view from the second lower surface of the second wiring substrate, and wherein a length of the first short side is longer than a center distance of the third terminals arranged adjacent to each other among the plurality of third terminals arranged on the second upper surface.

11. The electronic device according to claim 9,
wherein the second lower surface of the second wiring substrate has a seventh region overlapping with the fourth region of the second wiring substrate, and
wherein a second capacitor is mounted in the seventh region, and
wherein an area of the first capacitor is greater than an area of the second capacitor in plan view from the second lower surface of the second wiring substrate.

12. The electronic device according to claim 9, wherein the first capacitor has, in addition to the first electrode and the second electrode, a third electrode electrically connected to any of the plurality of first power supply terminals of the second wiring substrate via the first power supply through-hole wiring.

13. The electronic device of claim 8, wherein the number of the plurality of first power supply terminals disposed in the fourth region is greater than the number of the plurality of reference terminals disposed in the fourth region.

14. The electronic device of claim 13, wherein the plurality of terminals disposed adjacent to each of the plurality of first power supply terminals includes one or more reference terminals.

15. The electronic device of claim 14, wherein the plurality of terminals disposed adjacent to each of the plurality of first power supply terminals includes one or more first power supply terminals.

16. The electronic device of claim 15,
wherein the second region includes a fifth region surrounding a periphery of the fourth region,
wherein a plurality of fifth region terminals included in the plurality of second terminals are arranged in a row to surround a periphery of the fourth region, and
wherein the plurality of fifth region terminals includes the plurality of first power supply terminals and the plurality of reference terminals.

* * * * *